(12) United States Patent
Atsumi et al.

(10) Patent No.: US 6,985,043 B2
(45) Date of Patent: Jan. 10, 2006

(54) ATOMIC OSCILLATOR

(75) Inventors: Ken Atsumi, Sapporo (JP); Hideyuki Matsuura, Sapporo (JP); Akira Kikuchi, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 10/815,070

(22) Filed: Mar. 30, 2004

(65) Prior Publication Data
US 2005/0068115 A1 Mar. 31, 2005

(30) Foreign Application Priority Data
Sep. 29, 2003 (JP) .............................. 2003-337009

(51) Int. Cl.
*H01S 1/06* (2006.01)
(52) U.S. Cl. ..................... 331/94.1; 331/3; 331/74; 331/176
(58) Field of Classification Search ............... 331/3, 331/94.1, 74, 176
See application file for complete search history.

(56) References Cited

U.S. PATENT DOCUMENTS 6,300,841 B1 * 10/2001 Atsumi et al. ............. 331/94.1

6,570,455 B2 * 5/2003 Atsumi et al. ................ 331/3
6,614,321 B2 * 9/2003 Avinoam et al. ........... 331/94.1
6,710,663 B1 * 3/2004 Berquist ......................... 331/3

FOREIGN PATENT DOCUMENTS

JP 03-235422 10/1991

* cited by examiner

*Primary Examiner*—Arnold Kinkead
(74) *Attorney, Agent, or Firm*—Katten Muchin Rosenman LLP

(57) ABSTRACT

A compact atomic oscillator with improved frequency stability. A voltage-controlled oscillator generates an oscillation signal based on a given control voltage, and a modulator modulates it with a low-frequency signal. A phase-locked loop (PLL) upconverts the modulated oscillation signal directly to a first frequency in atomic resonance frequency band. The first frequency is an integer multiple of the oscillation signal. A frequency synthesizer produces a second frequency specified by a frequency setting unit, and a mixer combines the first and second frequencies to produce an RF signal for driving an atomic resonator. The amount of discharge lamp light passing through the atomic resonator depends on the difference between RF signal frequency and atomic resonance frequency. This quantity is measured as a resonance detection signal, and a frequency controller applies it to synchronous detection to produce a control voltage for the voltage-control oscillator.

10 Claims, 19 Drawing Sheets

T1

| CLOCK COUNT | ACCUMULATED PHASE OUTPUT | | | | |
|---|---|---|---|---|---|
| | BIT #3 | BIT #2 | BIT #1 | BIT #0 | DECIMAL |
| 0 | 0 | 0 | 0 | 0 | 0 |
| 1 | 0 | 0 | 1 | 1 | 3 |
| 2 | 0 | 1 | 1 | 0 | 6 |
| 3 | 1 | 0 | 0 | 1 | 9 |
| 4 | 1 | 1 | 0 | 0 | 12 |
| 5 | 1 | 1 | 1 | 1 | 15 |
| 6 | 0 | 0 | 1 | 0 | 2 |
| 7 | 0 | 1 | 0 | 1 | 5 |
| 8 | 1 | 0 | 0 | 0 | 8 |
| 9 | 1 | 0 | 1 | 1 | 11 |
| 10 | 1 | 1 | 1 | 0 | 14 |
| 11 | 0 | 0 | 0 | 1 | 1 |
| 12 | 0 | 1 | 0 | 0 | 4 |
| 13 | 0 | 1 | 1 | 1 | 7 |
| 14 | 1 | 0 | 1 | 0 | 10 |
| 15 | 1 | 1 | 0 | 1 | 13 |
| 16 | 0 | 0 | 0 | 0 | 0 |
| 17 | 0 | 0 | 1 | 1 | 3 |
| 18 | 0 | 1 | 1 | 0 | 6 |
| 19 | 1 | 0 | 0 | 1 | 9 |

FIG. 4

ATOMIC OSCILLATOR

BACKGROUND OF THE INVENTION

1. Field of the Invention

The present invention relates to an atomic oscillator, and particularly to an atomic oscillator whose resonance frequency derives from energy transitions of rubidium atoms.

2. Description of the Related Art

Rubidium atomic oscillators provide a constant frequency output by taking advantage of a highly stable resonance frequency of rubidium (Rb) atoms. Because of their extremely high frequency stability, rubidium oscillators are widely used as a frequency standard for television broadcast services and also as a high-accuracy timing source for digital synchronous networks and mobile communications systems. A high degree of accuracy is not the only thing that the customers demand; the market always seeks more compact and less costly solutions for rubidium frequency standards.

FIG. 18 shows a typical basic structure of an existing rubidium atomic oscillator. The illustrated rubidium atomic oscillator 100 is formed from a voltage-controlled crystal oscillator (VCXO) 101, a radio-frequency (RF) signal synthesizer 102, an atomic resonator 103, and a frequency controller 104.

The VCXO 101 is an electrically tunable oscillator, whose output frequency is determined by an external control voltage provided from the frequency controller 104. Besides being available for external use, the oscillation signal is supplied to the frequency synthesizer 102 for control purposes. In the frequency synthesizer 102, the given VCXO signal is phase-modulated with a low-frequency signal supplied from the frequency controller 104. The modulated signal then undergoes a process of frequency synthesis, which produces an RF signal of 6.83469 . . . GHz, the resonance frequency (natural frequency) of rubidium.

The atomic resonator 103 outputs a resonance detection signal as a response to the RF signal supplied from the frequency synthesizer 102. The frequency controller 104 has an internal low-frequency oscillator to create a low-frequency signal for modulation of the VCXO signal in the RF signal synthesizer 102. The same low-frequency signal is used to demodulate the resonance detection signal, which is the technique known as synchronous detection. The resulting control voltage is used to stabilize the frequency of VCXO 101.

As can be seen from the above, the rubidium atomic oscillator 100 regulates the VCXO output frequency, based on a resonance detection signal of the atomic resonator 103. It can therefore produce an oscillation signal that is as steady as the resonance frequency of rubidium atoms.

Since the oscillator output is supposed to serve as a reference clock signal for external circuits, it would be preferable if the oscillator can provide a particular frequency that is required. Actually, rubidium's resonance frequency is 6.83469 . . . GHz, which is not a simple number, but has many trailing digits. Consider, for example, that an external circuit needs a clock signal of 10 MHz. To meet the requirement, an appropriate integer multiple of 10 MHz is chosen as the oscillation frequency of the VCXO 101, within a frequency range where the VCXO 101 can work most stably. The VCXO output also serves as the seed frequency from which a frequency synthesizer produces an atomic resonance frequency signal of 6.83469 . . . GHz. Typically, a direct digital synthesizer (DDS) is employed to create an appropriate frequency from the integer multiple of 10 MHz. DDS devices offer flexible frequency setting capabilities, and are available in a single chip version. The created signal is then modulated and upconverted by a phase-locked loop (PLL) to yield an RF signal for driving an atomic resonator 103.

FIG. 19 is a block diagram of a rubidium atomic oscillator with a DDS-based RF signal generator. This rubidium atomic oscillator 200 comprises a VCXO 201, an RF signal synthesizer 202, an atomic resonator 203, a frequency controller 204, and a frequency divider 205. The RF signal synthesizer 202 is composed of a DDS 202a, a modulator 202b, a PLL 202c, and a frequency multiplier 202d. The example of FIG. 19 assumes the output frequency of 10 MHz for external use. The VCXO 201 is thus designed to produce a 20 MHz oscillation signal for use as a clock signal of the DDS 202a. Based on this 20-MHz signal, the DDS 202a synthesizes a lower-frequency signal of 4.952 . . . MHz, which is the result of integer division of rubidium atomic resonance frequency (i.e., 6.83469 . . . GHz/1380). The modulator 202b then modulates this signal and the PLL 202c and frequency multiplier 202d upconvert the modulated signal to yield an RF signal of 6.83469 . . . GHz. To be more specific, the PLL 202c contains a voltage-controlled oscillator (VCO) that produces a signal of 2.278 . . . GHz, and the modulated signal of 4.952 . . . MHz is used as a reference signal for the VCO. The frequency multiplier 202d triples this frequency, thus outputting 6.83469 . . . GHz. The frequency divider 205, on the other hand, halves the VCXO frequency, thus producing a 10-MHz signal for external use. Other circuit blocks shown in FIG. 19 operate in the same way as we described earlier in FIG. 18.

One example of an oscillator using frequency synthesizers is shown in the Japanese unexamined patent publication No. 3-235422 (1991), pages 1 to 3, FIG. 1. The oscillator generates an RF signal by mixing the outputs of a frequency synthesizer and a frequency multiplier, both of which operate with a source signal from a crystal oscillator. Instead of changing the division ratio of a single frequency synthesizer, the proposed oscillator employs a plurality of frequency synthesizers with different division ratios, so that one of their outputs will be subjected to the subsequent frequency mixing operation. The proposed oscillator design eliminates undesired transient response that a frequency synthesizer would make when it attempts to resynchronize itself in order to operate with a new frequency division ratio. The use of multiple synthesizers, however, increases the size of oscillator circuits.

Referring again to the rubidium atomic oscillator 200 of FIG. 19, the VCXO 201 supplies its oscillation signal to the DDS 202a as a clock input signal, and the output of this DDS 202a serves as a reference source for the PLL 202c. The frequency multiplier 202d multiplies the upconverted signal, thereby producing an RF signal. This conventional circuit arrangement is not optimal in terms of noise and spurious components that could be contained in the RF signal, as will be discussed below.

However successful the circuit design is in stabilizing the frequency, the oscillation signal of the VCXO 201 contains a certain amount of jitter (also referred to as "phase noise"). The problem with the conventional oscillator 200 is that the VCXO jitter is multiplied by the frequency multiplier 202d, together with the oscillation signal, resulting in a larger amount of jitter observed at the RF signal output. In addition, spurious components inherent in the DDS output could be another source of noise. For those reasons, the RF signal produced in the conventional oscillator 200 is contaminated with a considerable amount of noise, which causes degradation of signal-to-noise (S/N) ratio in detecting resonance of the atomic resonator 203. This problem holds also for the oscillator disclosed in the Japanese unexamined patent publication No. 3-235422 mentioned above. That is, the oscillator contains a multiplier to upconvert a crystal oscillator output. This means that the mixer receives an oscillation signal with increased jitter, which results in a large phase noise.

The output frequency of a conventional rubidium atomic oscillator (e.g., the oscillator 200) can be made variable to allow fine tuning. The common method is to shift the atomic resonance frequency by manipulating a magnetic field (known as "C field") in the atomic resonator 203. The problem here is that the curve of output frequency versus C-field strength is not linear. This non-linearity makes it difficult for users to control the output frequency of an atomic oscillator.

Another issue to consider is a drift of output frequency. Frequency drift of atomic oscillators stems from variations in the amount of rubidium lamp light due to temperature changes and aging of components used. For better long-term stability, the frequency conversion parameters of a DDS 202a has to be manipulated to compensate for the temperature variations or age deterioration. Conventional oscillators, including those shown in FIGS. 18 and 19 and Japanese unexamined patent publication No. 3-235422, lack the function of controlling such parameters, thus failing to avoid degradation of frequency stability.

SUMMARY OF THE INVENTION

In view of the foregoing, it is an object of the present invention to provide a compact, high-quality atomic oscillator with improved frequency stability.

To accomplish the above object, the present invention provides an atomic oscillator whose resonance frequency derives from atomic transitions. This atomic oscillator comprises the following blocks: a voltage-controlled oscillator; a radio-frequency (RF) signal synthesizer; an atomic resonator; a frequency controller; and a frequency setting unit. The voltage-controlled oscillator produces an oscillation signal based on a given control voltage. To produce an RF signal from this oscillation signal, the RF signal synthesizer comprises a modulator, a phase-locked loop (PLL), a frequency synthesizer, and a mixer. The modulator modulates the oscillation signal with a low-frequency signal given from the frequency controller. The PLL upconverts the modulated oscillation signal directly to a first frequency in atomic resonance frequency band. This first frequency is actually an integer multiple of the oscillation signal frequency. The frequency synthesizer, on the other hand, creates a second frequency according to a given frequency control word, by using the oscillation signal as an input clock signal. The mixer mixes those first and second frequencies to produce an RF signal for driving the atomic resonator. Inside the atomic resonator, atoms in an electromagnetic field of the RF signal interact with discharge lamp light passing therethrough, depending on the difference between the RF signal frequency and atomic resonance frequency. The atomic resonator has a sensor to produce a resonance detection signal representing the amount of unabsorbed discharge lamp light. The frequency controller produces a control voltage for the voltage-controlled oscillator by performing synchronous detection on the resonance detection signal. The frequency setting unit sets the frequency control word to specify the output frequency of the frequency synthesizer.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 4 shows a table representing the progression of accumulated phase values over time.

DESCRIPTION OF THE PREFERRED EMBODIMENTS

Figure 1:
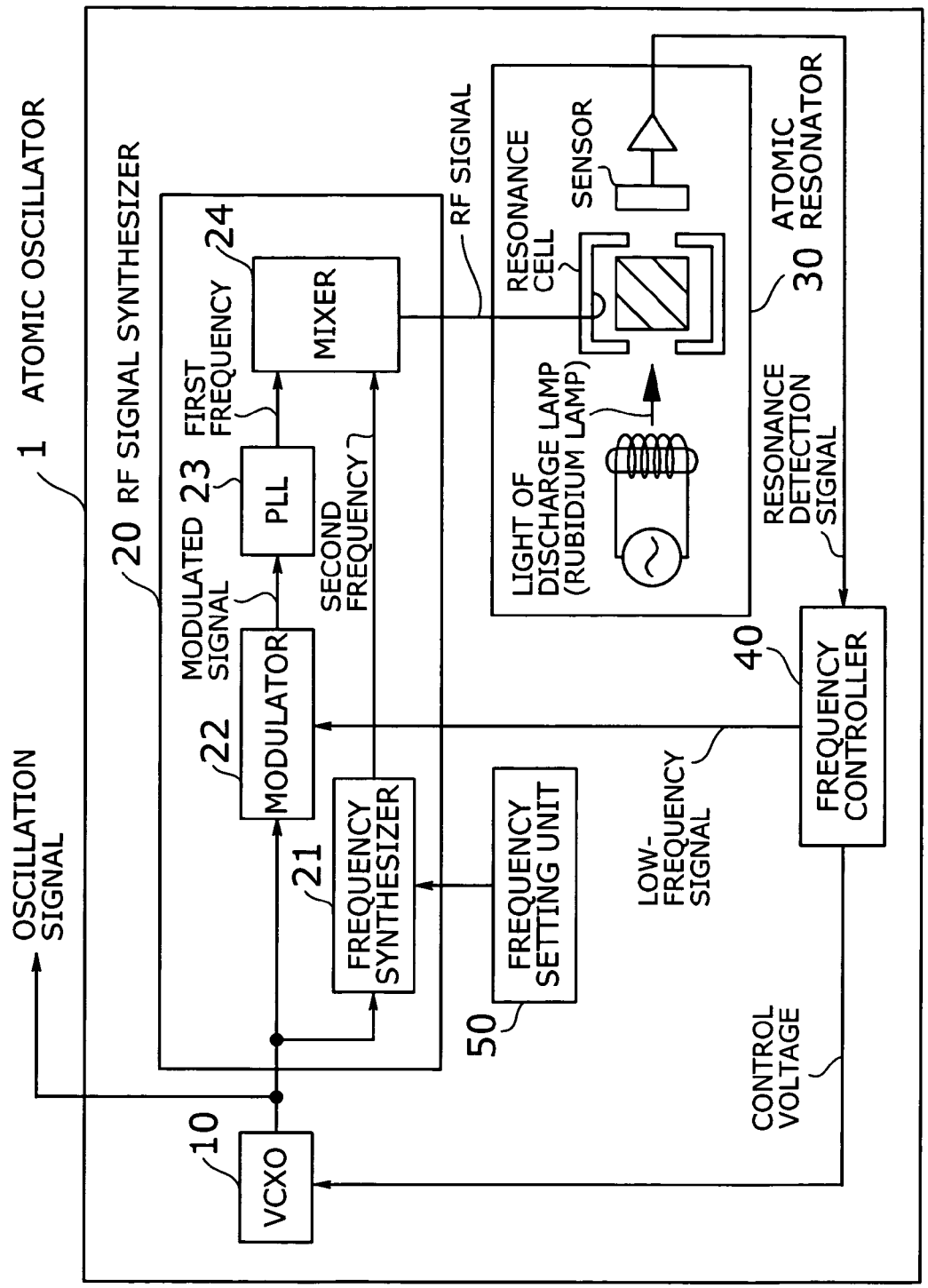
FIG. 1 is a conceptual view of an atomic oscillator according to the present invention.

Preferred embodiments of the present invention will be described below with reference to the accompanying drawings, wherein like reference numerals refer to like elements throughout.

FIG. 1 is a conceptual view of an atomic oscillator according to the present invention. This atomic oscillator 1 produces a clock signal whose frequency is determined by the energy transitions of Rubidium atoms. The atomic oscillator 1 comprises the following functional blocks: a voltage-controlled crystal oscillator (VCXO) 10, an RF signal synthesizer 20, an atomic resonator 30, a frequency controller 40, and a frequency setting unit 50.

With a given control voltage, the VCXO 10 produces an oscillation signal with a frequency as stable as the atomic resonance frequency for use in external devices. This oscillation signal is also supplied to an RF signal synthesizer 20, which is composed of a frequency synthesizer 21, a modulator 22, a PLL 23, and a mixer 24. Inside the RF signal synthesizer 20, the modulator 22 modulates the given oscillation signal with a low-frequency signal from the frequency controller 40, using a phase modulation (PM) or frequency modulation (FM) technique. The modulated signal is then given to the PLL 23 for upconversion into a first frequency in the atomic resonance frequency band (6.84 GHz). This first frequency is actually an integer multiple of the VCXO frequency, and the PLL 23 contains an oscillator (not shown) that can generate this frequency directly. Note that the word "directly" means "without using frequency multipliers" in this context. The frequency synthesizer 21 uses the given oscillation signal as an input clock in producing a second frequency specified by a frequency control word. The mixer 24 mixes the first and second frequencies supplied from the frequency synthesizer 21 and PLL 23, thus producing an RF signal for excitation of rubidium atoms.

The atomic resonator 30 contains a rubidium discharge lamp that emits a light into a rubidium resonance cell. The difference in frequency between the applied RF excitation signal and atomic resonance frequency causes a variation in the transmission of light traveling through the rubidium cell. The atomic resonator 30 has a photo sensor to detect and output this variation as a resonance detection signal.

The frequency controller 40 has an internal oscillator (not shown in FIG. 1) to create a low-frequency signal for use in the modulator 22. The frequency controller 40 uses this signal in synchronous detection of the resonance detection signal, thereby producing a control voltage for the VCXO 10. The frequency setting unit 50 gives frequency control parameters to the frequency synthesizer 21, so that its output frequency will be variable.

Atomic Oscillator

Figure 2:
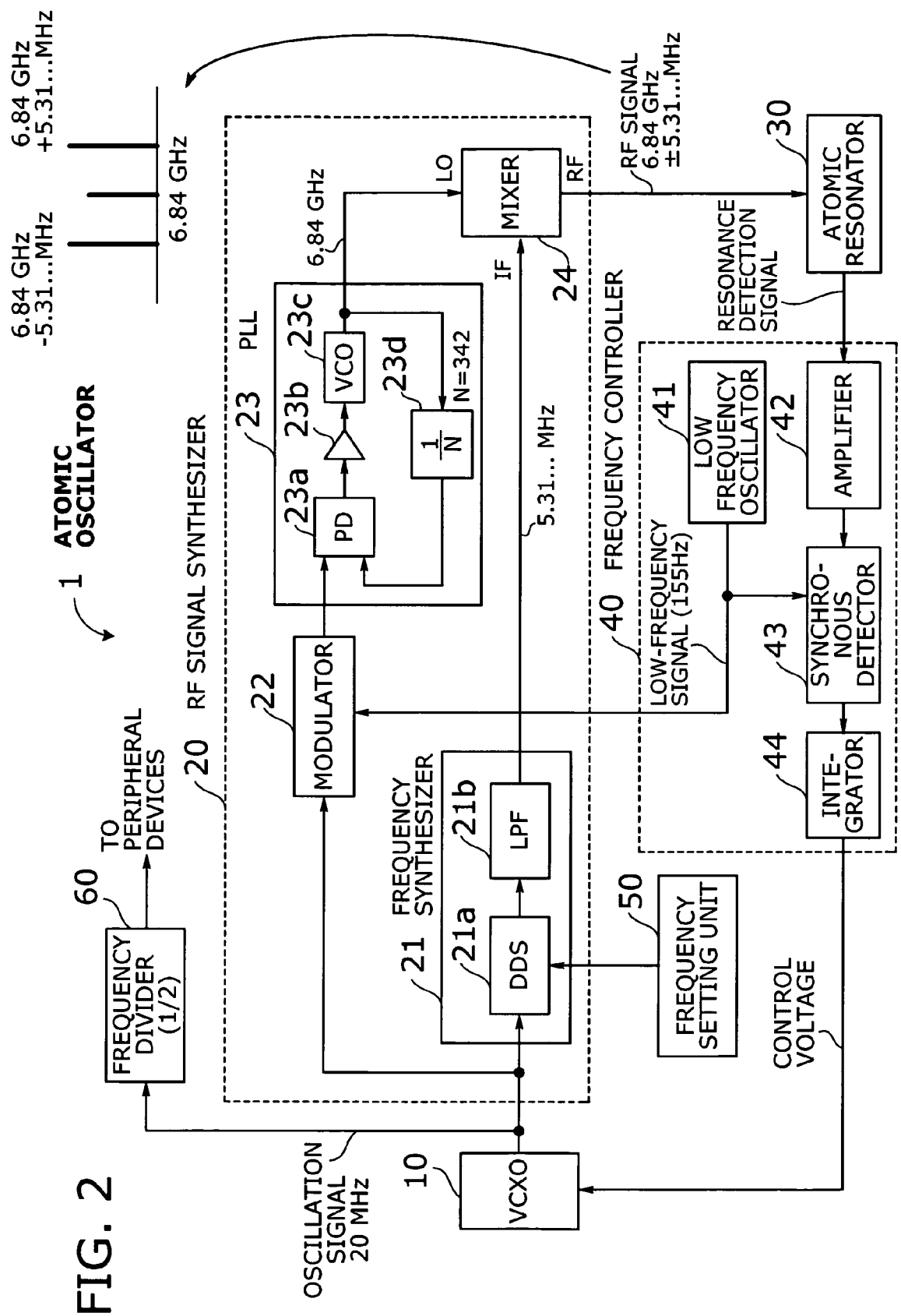
FIG. 2 shows detailed structure of an atomic oscillator.

A more specific structure and operation of the above-described atomic oscillator 1 will be discussed below. FIG. 2 shows the detailed structure of the atomic oscillator 1, particularly placing focus on the RF signal synthesizer 20 and frequency controller 40. The illustrated atomic oscillator 1 contains a VCXO 10 operating at 20 MHz, and it is designed to provide external devices with a frequency of 10 MHz by halving the VCXO output with a frequency divider 60.

Inside the RF signal synthesizer 20, the frequency synthesizer 21 is composed of a DDS 21a and a low pass filter (LPF) 21b, while the PLL 23 provides a frequency up-conversion function with a phase detector (PD) 23a, a loop filter 23b, a VCO 23c, and an N:1 frequency divider 23d. Note that the PLL 23 contains no frequency multiplier. The frequency controller 40 comprises a low frequency oscillator 41, an amplifier 42, a synchronous detector 43, and an integrator 44.

The VCXO 10 produces an oscillation signal of 20 MHz according to a given control voltage and supplies it to the DDS 21a and modulator 22. The modulator 22 phase-modulates the oscillation signal (20 MHz) with a low-frequency signal (155 Hz) from the frequency controller 40. The modulated signal is sent to the PLL 23 as a frequency reference signal. The PLL 23 has an inner feedback control loop to maintain a constant phase difference between the modulated signal and VCO output signal, so that the VCO 23c will directly generate an RF oscillation signal of 6.84 GHz in synchronization with the given modulated signal. This frequency 6.84 GHz is 342 times as high as the VCXO frequency, 20 MHz, for use in the atomic resonator 30.

In the PLL 23, the phase detector 23a detects the difference in phase between the modulated signal and the output of the N:1 frequency divider 23d, and the loop filter 23b averages the phase difference with an appropriate time constant. The VCO 23c controls its output frequency (6.84 GHz) according to the mean phase difference supplied from the loop filter 23b. The N:1 frequency divider 23d divides the output of the VCO 23c by N for phase comparison in the subsequent phase detector 23a. The division factor N is 342 (6.84 GHz/20 MHz) in the present example. The 6.84 GHz output of the PLL 23 is sent to the mixer 24 as a local oscillator (LO) signal.

In the frequency synthesizer 21, on the other hand, the DDS 21a produces a different frequency from the oscillation signal (20 MHz) of the VCXO 10 according to frequency control word given by the frequency setting unit 50. This frequency is 5.31 . . . MHz in the example of FIG. 2, which is "offset frequency" of the PLL output (6.84 GHz) with respect to the atomic resonance frequency (6.83469 . . . GHz). The DDS 21a is followed by the LPF 21b, which removes spurious components (undesired harmonics components) from the DDS output signal. We will explain more about the basic structure and operation of the DDS 21a, as well as about spurious spectrum components, with reference the FIGS. 3 to 7.

The mixer 24 mixes its intermediate frequency (IF) input (offset frequency, 5.31 . . . MHz) with the 6.84-GHz LO signal from the PLL 23, thus producing a radio frequency (RF) output of 6.84 GHz±5.31 . . . MHz. By applying this RF signal to the atomic resonator 30, a microwave field is produced in the rubidium cell, through which discharge lamp light runs. The strongest interaction between rubidium atoms and lamp light occurs when the microwave frequency matches with the atomic resonance frequency of rubidium. It is 6.83468 . . . GHz, or the lower sideband component (6.84 GHz–5.31 . . . MHz) of the RF signal. The resonance detection signal indicates the amount of unabsorbed discharge lamp light, which is a function of the difference between the RF signal frequency and rubidium's atomic resonance frequency. We will provide more details about the atomic resonator 30 and resonance detection signal later in FIGS. 9 and 10.

In the frequency controller 40, the low frequency oscillator 41 generates and supplies a low-frequency signal (155 Hz) to the modulator 22 and synchronous detector 43. The amplifier 42 amplifies a resonance detection signal, and the synchronous detector 43 demodulates this amplified signal in synchronization with the original low-frequency signal, thus producing an error signal. The integrator 44 translates the error signal into dc voltage for use as a control voltage for the VCXO 10.

Direct Digital Synthesizer

Figure 3:
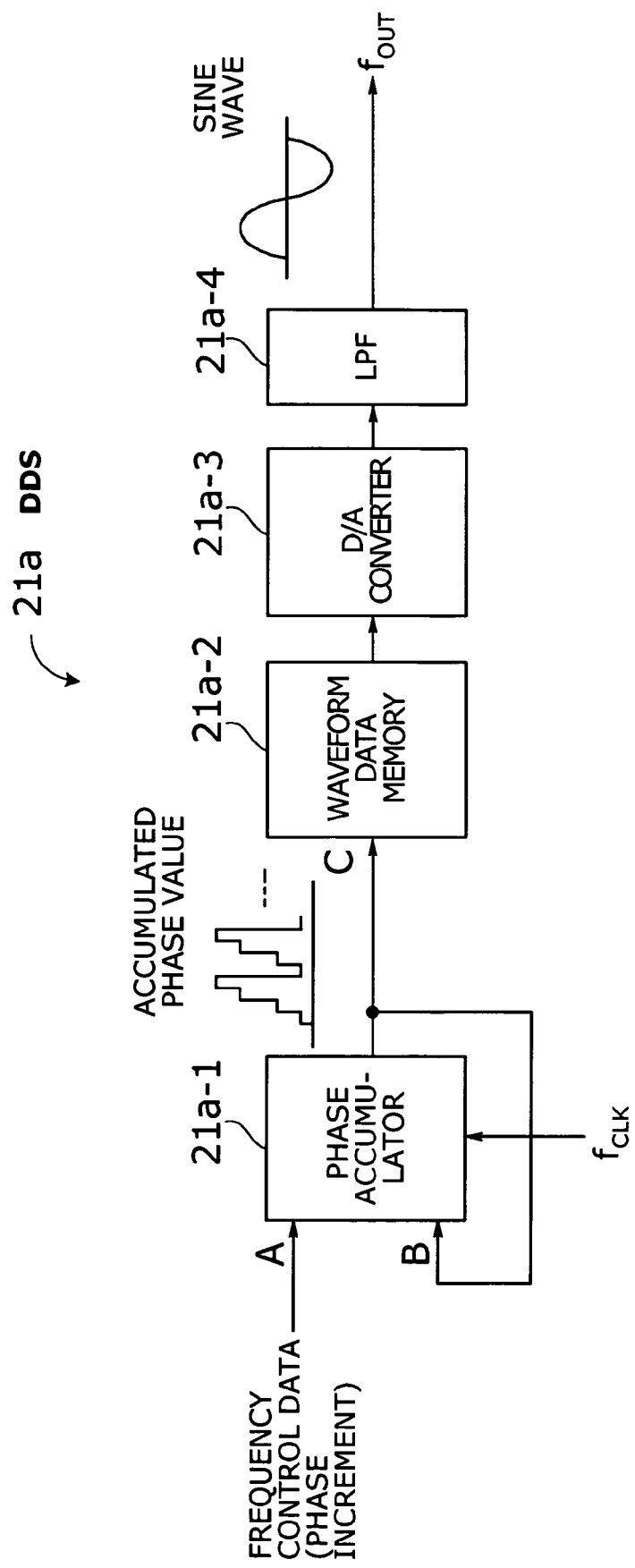
FIG. 3 is a simplified block diagram of a direct digital synthesizer (DDS).

Referring next to FIGS. 3 to 7, this section explains the structure and operation of the DDS 21a. FIG. 3 is a simplified block diagram of the DDS 21a, which is composed of a phase accumulator 21a-1, a waveform data memory 21a-2, a D/A converter 21a-3, and an LPF 21a-4.

The phase accumulator 21a-1 is composed of a full adder and a register although they are not shown in FIG. 3. The full adder adds two input values A and B at clock intervals $f_{CLK}$ given by the VCXO 10, and the register holds the sum for use as the next input B. What is given to input A is a phase increment, or step size, specified by the frequency setting unit 50 in the form of a frequency control word. The output C of the phase accumulator 21a-1, which is fed back to the input B, is referred to as the accumulated phase value, which can be represented graphically in a digital sawtooth waveform.

The waveform data memory 21a-2 stores a lookup table containing sinusoidal values corresponding to different phase angles. Given a series of accumulated phase values C as its address input, the waveform data memory 21a-2 generates a digital sine wave. The D/A converter 21a-3 converts this sine wave into an analog signal, and the LPF 21a-4 selectively outputs a pure sine wave with the desired frequency $f_{OUT}$, while removing unwanted noise components from the signal.

The following will describe how the DDS 21a of FIG. 3 operates. For illustration, think of a simplified phase accumulator 21a-1 with a data width of four bits. This means that both full adder and register inside the phase accumulator 21a-1 are four bits in length. We also assume a phase increment of three.

FIG. 4 shows a table T1 representing the progression of accumulated phase values that the 4-bit phase accumulator 21a-1 generates over time. The clock count is incremented each time a new clock pulse comes, and the accumulated phase value increases by three (=phase increment) at a time, the change of which appears at the four digits (bit #0 to bit #3) of the phase accumulator 21a-1. See, for example, the topmost three rows of table T1. The accumulated phase value starts with an initial value of $(0000)_2=(0)_{10}$ at count "0." It goes up to $(0011)_2=(3)_{10}$ at count "1" and then to $(0110)_2=(6)_{10}$ at count "2," as a result of addition of a phase increment of three. The phase accumulator 21a-1 repeats the same additions over and over, but within the limitation of its data length. Since the phase accumulator 21a-1 in the present example is four bits long, the phase can take values in the range of 0000 to 1111 in binary (0 to 15 in decimal). Accordingly the accumulated phase value goes up from the starting point zero until it hits a maximum at clock count "5." The phase accumulator then rolls back to $(0010)_2=(2)_{10}$ at the next clock count "6," and then begins to go up again. The resulting accumulator output is a digital sawtooth wave.

Figure 5:
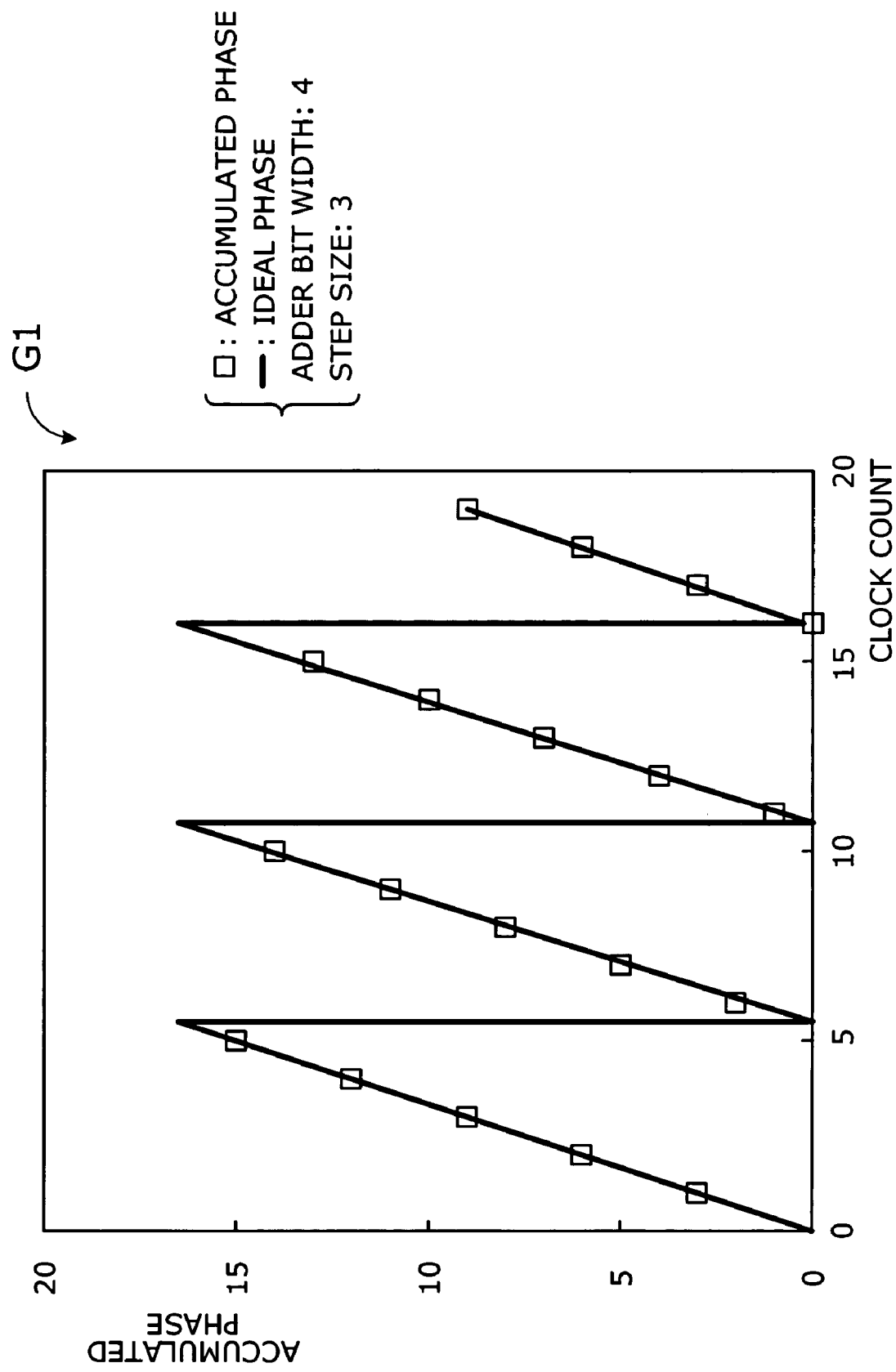
FIG. 5 is a graph representing the phase accumulator output.

FIG. 5 is a graph showing how the accumulator output varies with the progression of clock count. This graph G1 is a plot of accumulated phase values in the table T1 of FIG. 4. The small rectangles represent discretized phase values, while the bold solid line represents an ideal sawtooth waveform corresponding to them.

Figure 6:
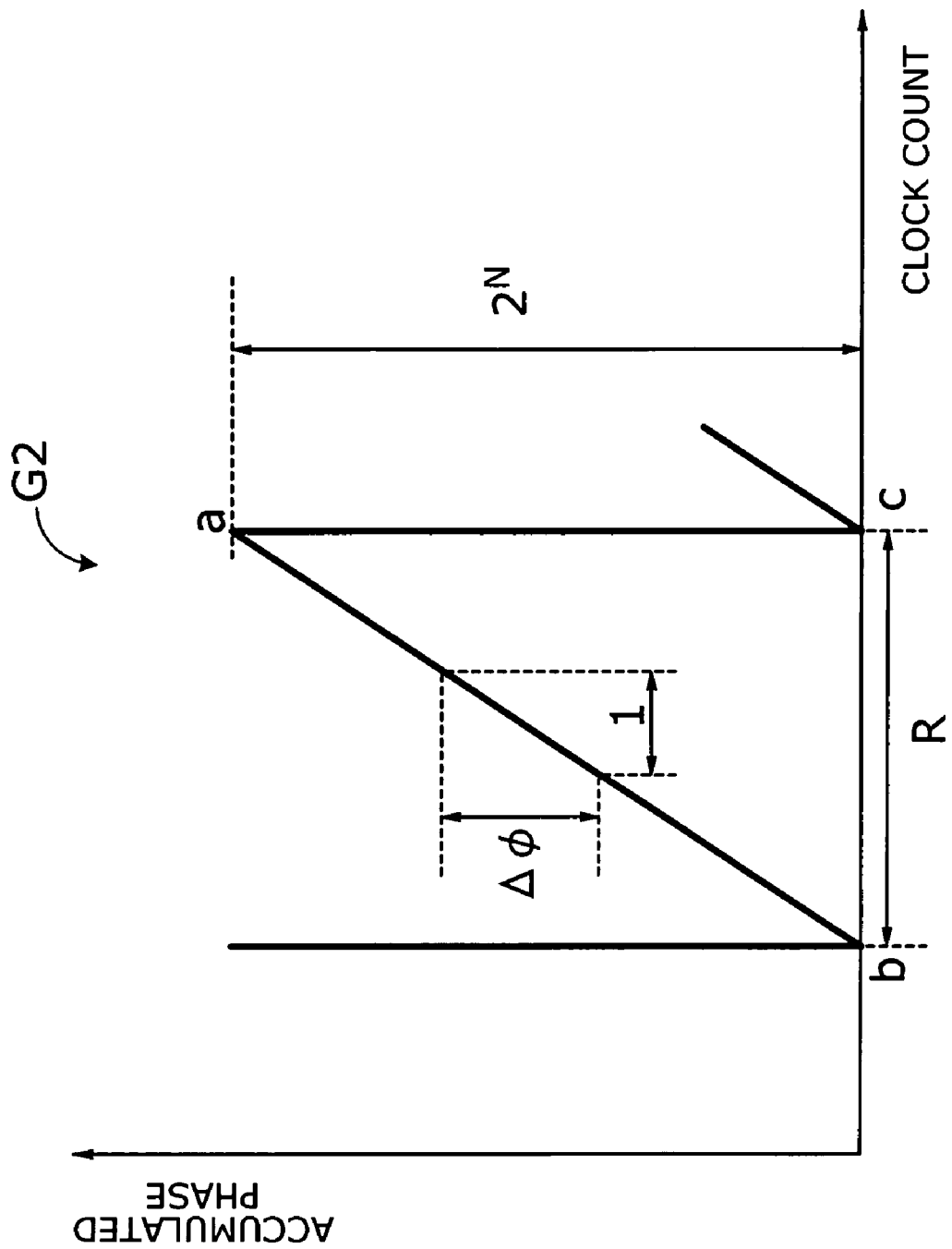
FIG. 6 shows the increase rate of accumulated phase values.

FIG. 6 is a graph showing the increase rate of accumulated phase values, where the vertical axis represents accumulated phase values and the horizontal axis represents clock count. This graph G2 focuses on one sawtooth $\Delta abc$, the bottom of which corresponds to the cycle period R of the wave, and the height of which is $2^N$ (N: accumulator width in bits). The height of $\Delta abc$ is sixteen in the present example, since N is four.

Let $\phi$ represent the phase, and $\Delta\phi$ the phase increment per clock count. Then the following equation (1a) holds, which derives the next formula (1b) for the cycle time R of the sawtooth wave.

$$\tan \angle abc = \frac{2^N}{R} = \Delta\phi \quad (1a)$$

$$R = \frac{2^N}{\Delta\phi} \quad (1b)$$

This cycle time value R denotes the number of clock counts that make the phase accumulator 21a-1 overflow and roll back to the bottom level. In the present case, it is five clocks ($R=2^4/3\approx5$). The cycle period ($1/f_{OUT}$) of DDS output can be calculated from the following equation (2a), since one period contains R cycles of input clocks $f_{CLK}$.

$$\frac{1}{f_{OUT}} = \frac{1}{f_{CLK}} \cdot R \quad (2a)$$

Accordingly, the output frequency $f_{OUT}$ is expressed as $$f_{OUT} = \frac{f_{CLK}}{R} = \frac{\Delta\phi}{2^N} \cdot f_{CLK} \quad (2b)$$

This equation (2b) tells us that we need to raise the clock frequency $f_{CLK}$ to yield a higher output frequency $f_{OUT}$ when the phase increment $\Delta\phi$ and accumulator width N are both fixed. This is, however, not how we actually do it, since the DDS 21a operates with a fixed clock frequency $f_{CLK}$ delivered from a stable VCXO 10. To increase or decrease the output frequency $f_{OUT}$, we change the phase increment $\Delta\phi$ by modifying the frequency control word from the frequency setting unit 50.

The DDS 21a described in FIG. 2 generates a frequency of 5.31 . . . MHz, which is an offset between the PLL output frequency (6.84 GHz) and atomic resonance frequency (6.83468 . . . GHz). Accordingly, the frequency setting unit 50 is supposed to set its frequency control word $\Delta\phi$ as follows.

$$\Delta\phi = \frac{2^N}{f_{CLK}} \cdot f_{OUT} = \frac{2^N}{20 \text{ MHz}} \cdot 5.311 \ldots \text{ MHz} \quad (3)$$

Another issue about the DDS 21a is its frequency resolution. As equation (2b) indicates, the DDS output frequency $f_{OUT}$ is a function of phase increment $\Delta\phi$ if the clock frequency $f_{CLK}$ and accumulator width N are fixed. Frequency setting resolution $\Delta f$ of the DDS 21a is defined as the ratio of output frequency $f_{OUT}$ to phase increment $\Delta\phi$, which is written as follows.

$$\Delta f = \frac{f_{OUT}}{\Delta\phi} = \frac{f_{CLK}}{2^N} \quad (4)$$

That is, the frequency setting resolution depends on the accumulator width N, where a larger N will give a better resolution. Think of, for example, a DDS with 26-bit accumulator. With an input clock $f_{CLK}$ of 67.108864 MHz, the resolution of this DDS will be 1 Hz because $(67.108864\times10^6)/2^{26}=(67.108864\times10^6)/67108864=1$.

Spurious Components and Phase Noise

This section will discuss the problem of spurious signals in the DDS 21a. Digital synthesizers like this DDS generates a sinusoidal wave by using a wave table for conversion from the accumulated phase value that changes within a range determined by the accumulator width. (Recall that, in the example of FIGS. 4 and 5, the phase accumulator takes sixteen different values since the accumulator width is four bits.) The output of a wave table, however, is not an ideal sine wave, but it inevitably contains a certain amount of inaccuracy or phase error, as well as unwanted harmonic wave components, known as spurious signals, accompanying the intended frequency signal. The presence of spurious noise mandates the lowpass filtering after the DDS 21a.

Figure 7:
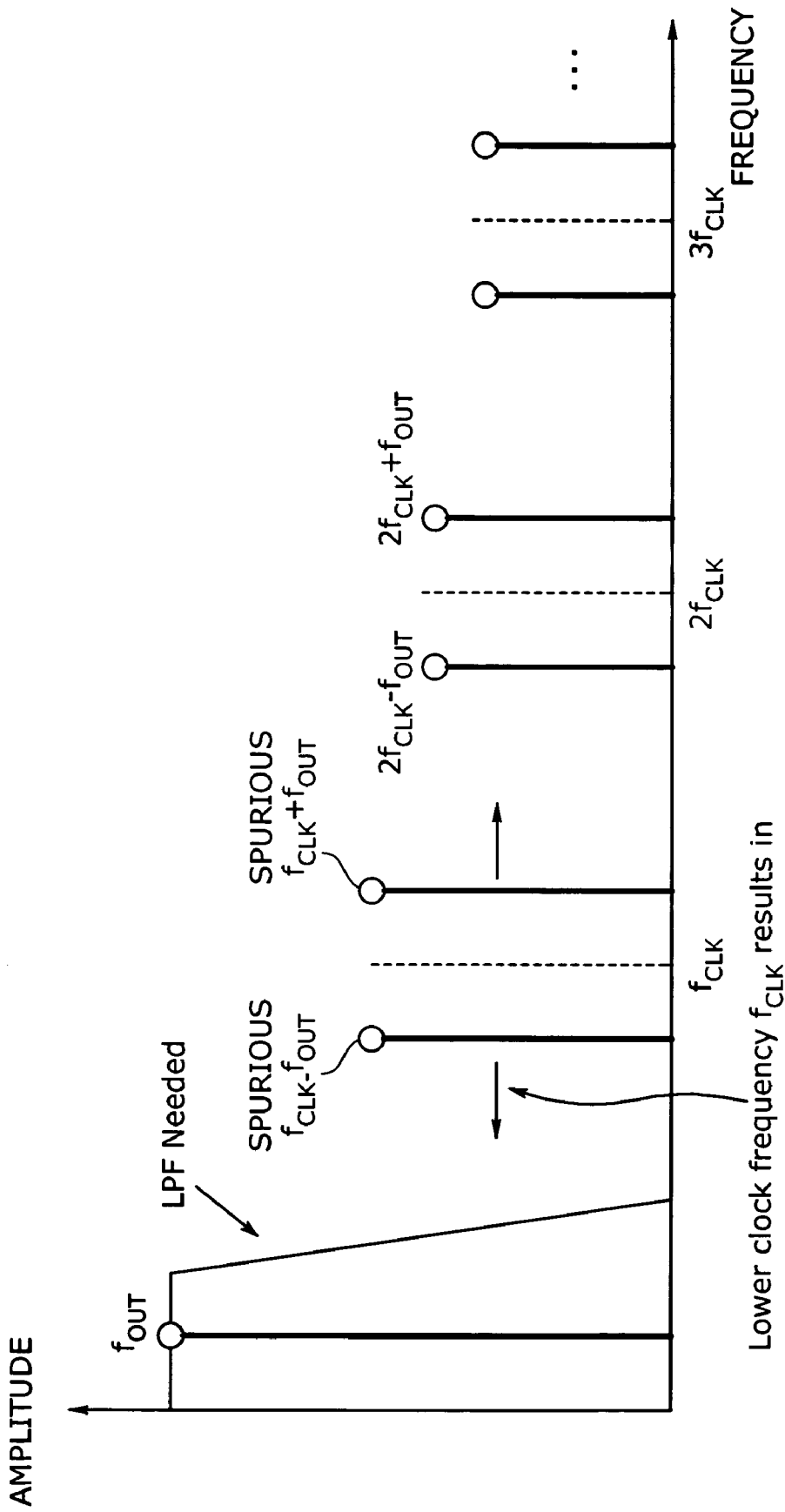
FIG. 7 shows a spectrum of spurious components introduced by a DDS.

FIG. 7 shows spectral components contained in the DDS output. The vertical axis represents amplitude, and the horizontal axis represents frequency. The broken lines indicate clock frequency $f_{CLK}$ given to the DDS 21a (or the output frequency of VCXO 10) and its harmonics $2f_{CLK}$, $3f_{CLK}$, ... $n^*f_{CLK}$. Each of those frequencies is accompanied by spurious components at a distance of $f_{OUT}$, the output frequency of the DDS 21a.

When clock frequency $f_{CLK}$ is sufficiently far from output frequency $f_{OUT}$, all unwanted frequencies can be removed with a simple LPF 21b because of their spectral distance from $f_{OUT}$. However, if clock frequency $f_{CLK}$ is close to output frequency $f_{OUT}$, the lowest spurious component will be near the output frequency $f_{OUT}$, thus requiring the LPF 21b to have a multistage structure to provide a sharp cut-off.

Another concern is phase noise of the RF signal, which is what the present invention is intended to address. Referring back to the conventional atomic oscillator 200 we discussed earlier in FIG. 19, the DDS 202a operates with a clock input that is provided as an oscillation signal of the VCXO 201. The PLL 202c uses DDS output as a reference signal in the process of RF signal generation, including frequency conversion and multiplication.

As mentioned, the oscillation signal of the VCXO 201 contains a certain amount of jitter, or phase fluctuations, however successful the circuit design is in stabilizing the frequency. Although this jitter may originally be small in magnitude, it could grow to a noticeable level in the process of frequency multiplication, which the conventional oscillator 200 involves to produce an RF signal from the VCXO output. In addition, the conventional oscillator 200 employs a DDS to create a reference input signal for the PLL. The DDS output, however, contains spurious components as we discussed earlier. While most part of the spurious signals can be reduced by placing a post-DDS lowpass filter, it is hard to eliminate them completely.

Rubidium atomic oscillators are supposed to have an extremely high spectral purity. In reality, however, the RF signal to drive an atomic resonator 203 contains some amount of noise, which reduces the signal-to-noise ratio of the resonance detection signal. This is an impediment to improved frequency stability, but the conventional atomic oscillator 200 is unable to solve the noise contamination problem because of its structural limitation.

Frequency stability $\sigma_y(\tau)$ of an atomic oscillator is a function of S/N ratio of the resonance detection signal, which can be generally expressed as follows.

$$\sigma_y(\tau) = \frac{0.2}{Q(S/N)\sqrt{\tau}} \quad (5)$$

where $\tau$ is measurement time, and a larger $\sigma_y(\tau)$ value means lower stability. A high frequency stability of an oscillator is represented by its narrower resonance bandwidth, or a high Quality factor Q. Equation (5) indicates that, as the S/N ratio degrades, the Q-factor decreases and $\sigma_y(\tau)$ raises, which means an increased bandwidth and a lower frequency stability.

Unlike the conventional oscillator 200, the atomic oscillator 1 of the present invention can reduce the effect of noise on the frequency stability. As can be seen from FIG. 2, the present invention uses no frequency multiplier to generate an RF signal. Instead, the PLL 23 upconverts a modulated version of the VCXO oscillation signal directly to a microwave-band signal, and a mixer 24 produces a desired RF signal by combining the DDS and PLL outputs.

Figure 8:
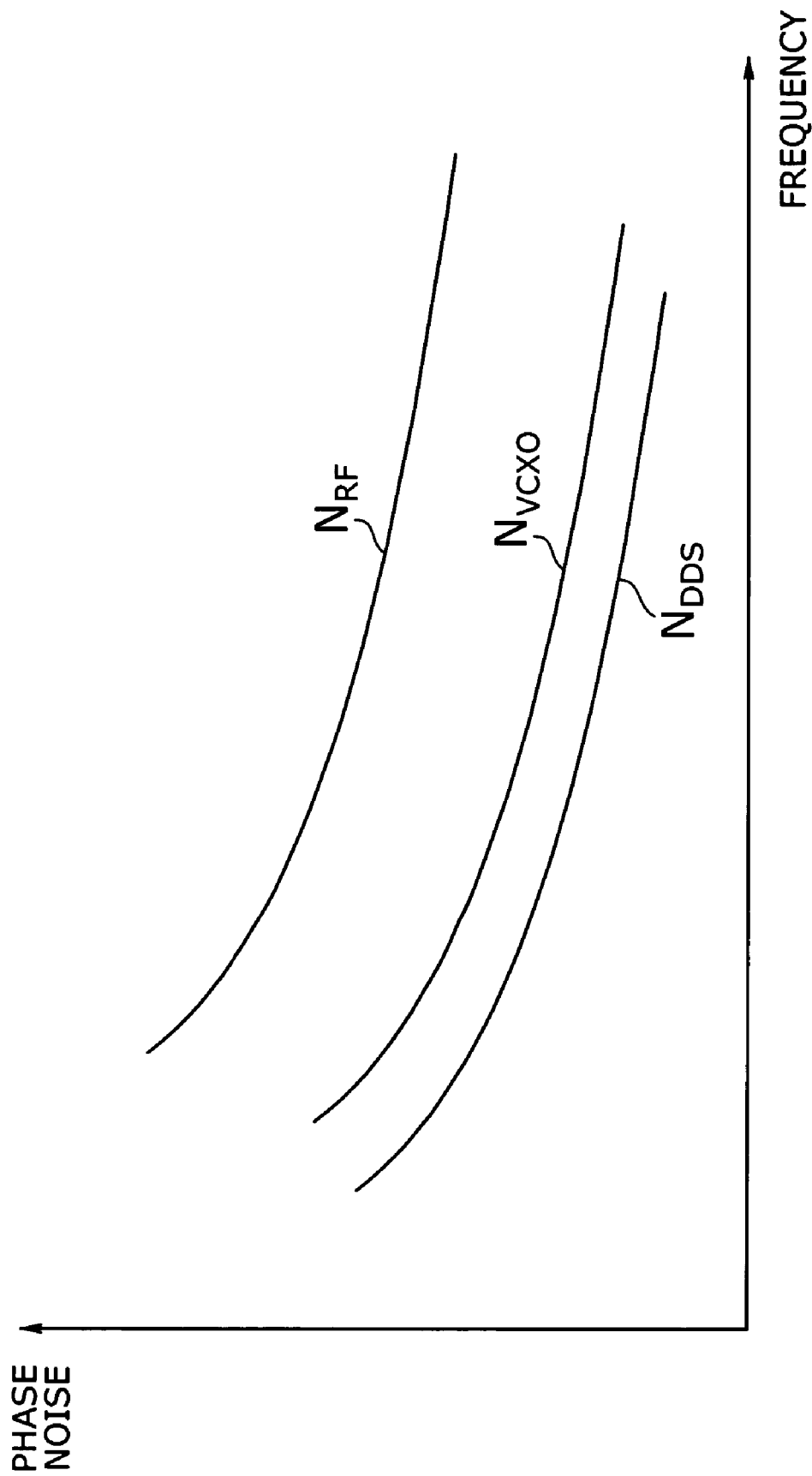
FIG. 8 gives an overview of phase noise characteristics.
Figure 19:
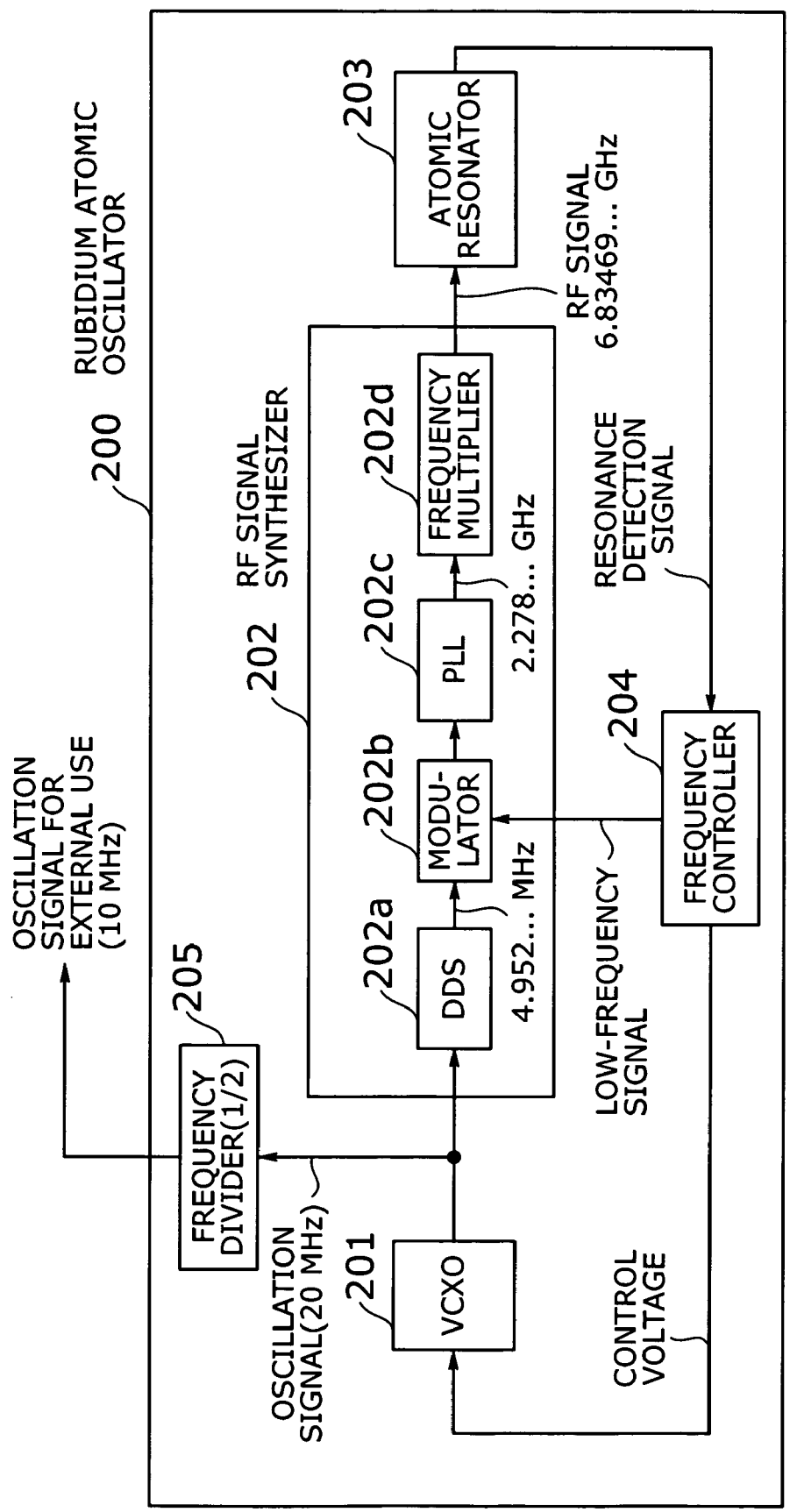
FIG. 19 shows the structure of a conventional rubidium atomic oscillator with a DDS-based RF signal generator.

FIG. 8 gives an overview of phase noise characteristics of the conventional oscillator 200 of FIG. 19, where the vertical axis represents the magnitude of phase noise and the horizontal axis represents frequency. The graph compares phase noise levels observed at the following three different points: $N_{DDS}$ at the output of DDS 202a, $N_{VCXO}$ at the output of VCXO 201, and $N_{RF}$ at the output of RF signal synthesizer 202. As seen, the phase noise level $N_{DDS}$ of DDS output is observed as being lower than $N_{VCXO}$ of VCXO output. This is because the DDS 202a divides the frequency of VCXO output. The phase noise level $N_{RF}$ of RF signal, on the other hand, is greater than $N_{VCXO}$ of VCXO output as a result of frequency multiplication.

One shortcoming of the conventional oscillator structure is that spurious components in the DDS output directly affect the RF signal, because of the cascaded arrangement of the PLL and DDS. The RF signal synthesizer 20 of the present invention avoids it by placing a PLL and DDS in a parallel manner, so that the two elements can operate independently.

Another shortcoming of the conventional structure is that the RF signal contains much larger phase noise than the VCXO output has. This problem comes from the presence of a frequency multiplier 203d after the PLL 203c. To circumvent this problem, the present invention eliminates the use of a post-PLL frequency multiplier, so that the phase noise of PLL output can be as small as the jitters that the VCXO and VCO (in PLL) originally have. As a matter of fact, those jitters are well within the tolerance limits allowed by the specifications of an atomic oscillator.

According to the present invention, the PLL contains a VCO that can directly produce a high-frequency signal (6.84 GHz) in the atomic resonance frequency band of rubidium. The PLL control circuit keeps this VCO oscillation signal in synchronization with the VCXO signal given as a reference source. Modern circuit technology enables this high frequency to be generated without using frequency multipliers. The present invention also employs a mixer in the RF signal synthesizer design; the PLL output signal is given to a mixer as its local oscillator (LO) signal input.

Another signal the mixer receives is a DDS oscillation signal. While its output contains spurious noise, the DDS offers a capability of fine-tuning the frequency. This feature is suitable for generating an offset frequency between the atomic resonance frequency (6.83469 ... GHz) and PLL output frequency (6.84 GHz). The offset frequency is actually 5.31 ... MHz, which is far below the atomic resonance frequency band. The DDS output is referred to as an intermediate frequency (IF) input signal, from the mixer's viewpoint. Main signal components appearing at the mixer's output include 6.84 GHz, 6.84 GHz +5.31 ... MHz, and 6.84 GHz −5.31 ... MHz. In the present embodiment, the lower sideband component, 6.83469 ... GHz, plays an active role in the atomic resonator.

As mentioned above, IF input frequency (5.31 ... MHz) is extremely lower than LO input frequency (6.84 GHz). Subtraction of 5.31 ... MHz from 6.84 GHz yields an RF signal in the microwave band. While the IF signal may contain some phase noise, its relative effect on the subtraction result is very small.

The above-described structure of an atomic oscillator reduces the effect of noise on the frequency stability. Besides allowing the use of a simplified post-DDS filter (LPF), the present invention eliminates a frequency multiplier. Those features and advantages contribute to size reduction of the oscillator device.

Atomic Resonator

Figure 9:
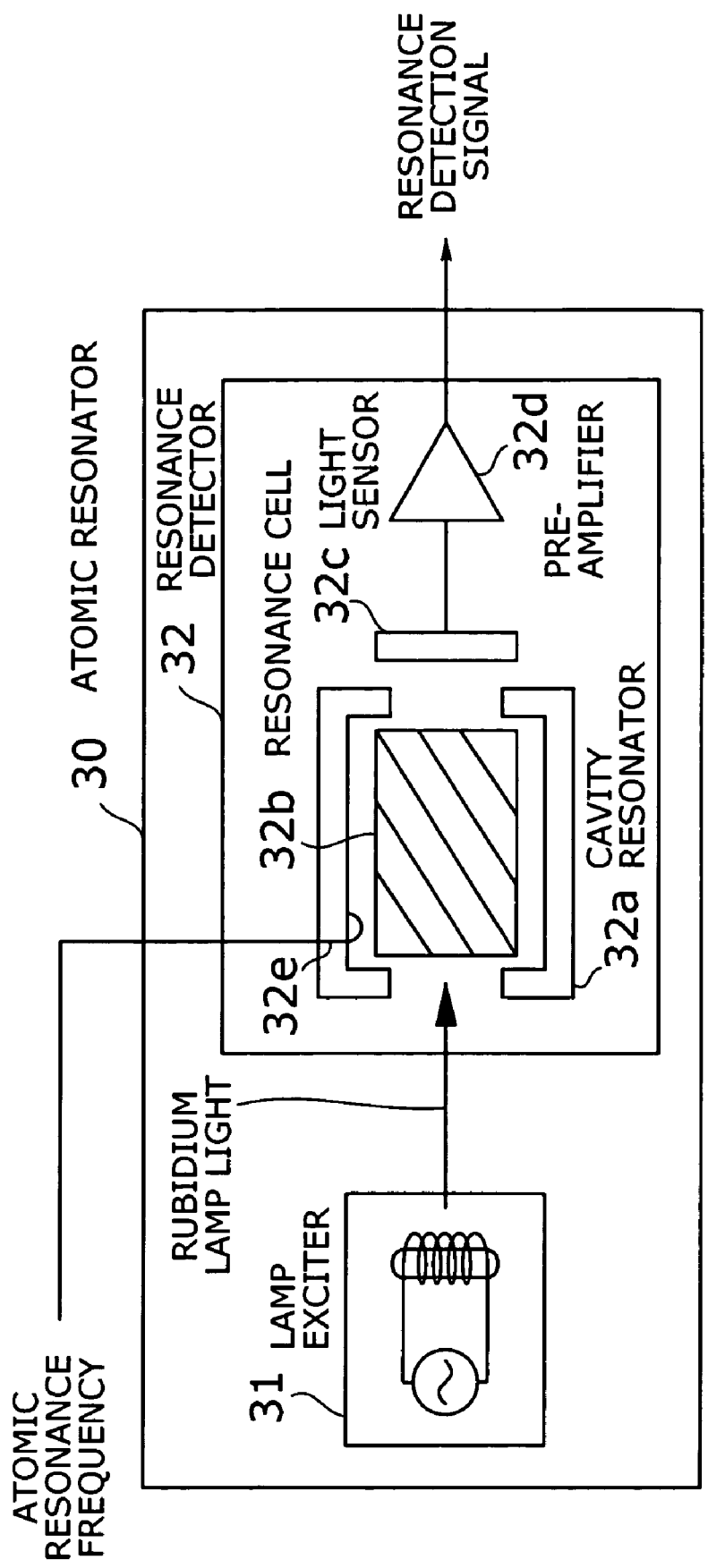
FIG. 9 shows the structure of an atomic resonator.

Referring to FIG. 9, this section will describe the structure of an atomic resonator 30. The illustrated atomic resonator 30 is formed from a lamp exciter 31 and a resonance detector 32. The resonance detector 32 is composed of a cavity resonator 32a, a resonance cell 32b, a light sensor (photodiode) 32c, a preamplifier 32d, and an excitation antenna 32e.

In operation, the RF signal synthesizer 20 supplies an RF signal to an excitation antenna 32e disposed in the cavity resonator 32a. The RF signal produces a microwave field in the cavity resonator 32a. The cavity resonator 32a is tuned to 6.83468 GHz, the resonance frequency of rubidium atoms, with a built-in resonance cell 32b containing rubidium vapor. The lamp exciter 31 energizes a rubidium discharge lamp, thus irradiating rubidium vapor in the resonance cell 32b with discharge lamp light (rubidium lamp light). Some of the rubidium lamp light is absorbed by the rubidium vapor, depending on the frequency of a microwave field in the resonance cell 32b. The remaining part of the light reaches the end of the resonance cell 32b and is detected by the light sensor 32c. Rubidium atoms resonate when the microwave frequency matches with the rubidium resonance frequency, resulting in an increased absorption of lamp light by the rubidium vapor. The light sensor 32c detects this condition as a drop of the received lamp light intensity. Since the RF signal is phase-modulated with a low-frequency signal, the output of the light sensor 32c exhibits a maximum drop at a particular phase angle where the RF signal frequency matches exactly with the rubidium resonance frequency. In other words, at this maximum drop point of the light sensor 32c, the RF signal has no frequency error with respect to the rubidium resonance frequency. The phase angles other than the maximum drop point indicate that the RF signal is either above or below the rubidium resonance frequency. In this case the light sensor output exhibits a phase shift of π, with respect to the rubidium resonance frequency.

The light sensor 32c produces an ac signal according to the above principle, and this resonance detection signal is sent to the frequency controller 40 after being amplified by a preamplifier 32d. At the frequency controller 40, the resonance detection signal undergoes synchronous detection with reference to the low-frequency signal that is used in phase-modulation of the microwave signal. The resulting dc signal serves as a control voltage for the VCXO 10.

Figure 10:
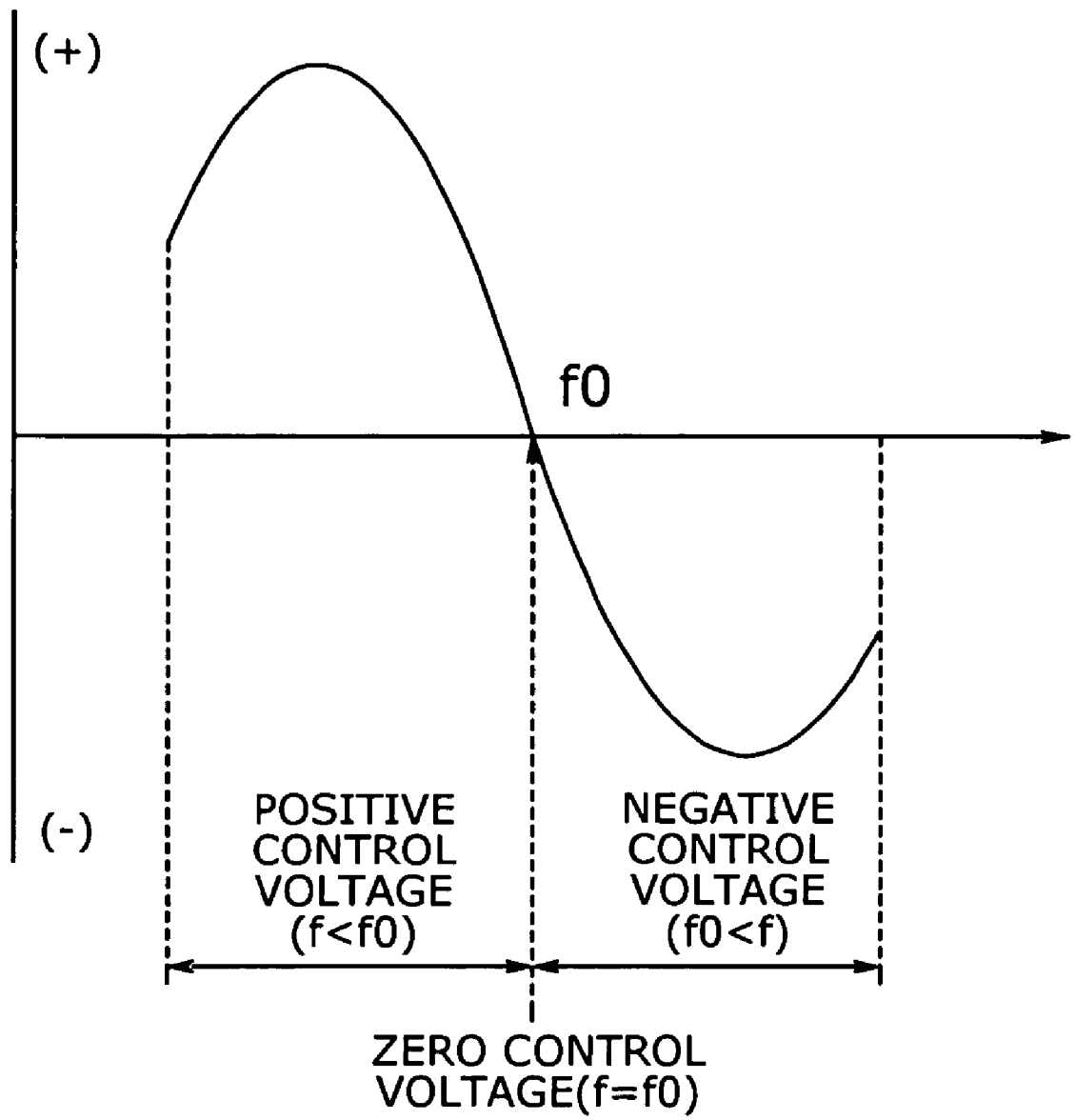
FIG. 10 shows the relationship between frequency deviation and control voltage.

FIG. 10 shows the relationship between frequency deviation and control voltage. Let f represent the RF signal frequency, and f0 the rubidium resonance frequency. The frequency controller 40 produces positive control voltages when f<f0, zero control voltage when f=f0, and negative control voltages when f0<f. This control voltage enables the VCXO 10 to keep its output frequency at a constant value as stably as the rubidium resonance frequency.

Atomic Oscillator with External Control Input

Figure 11:
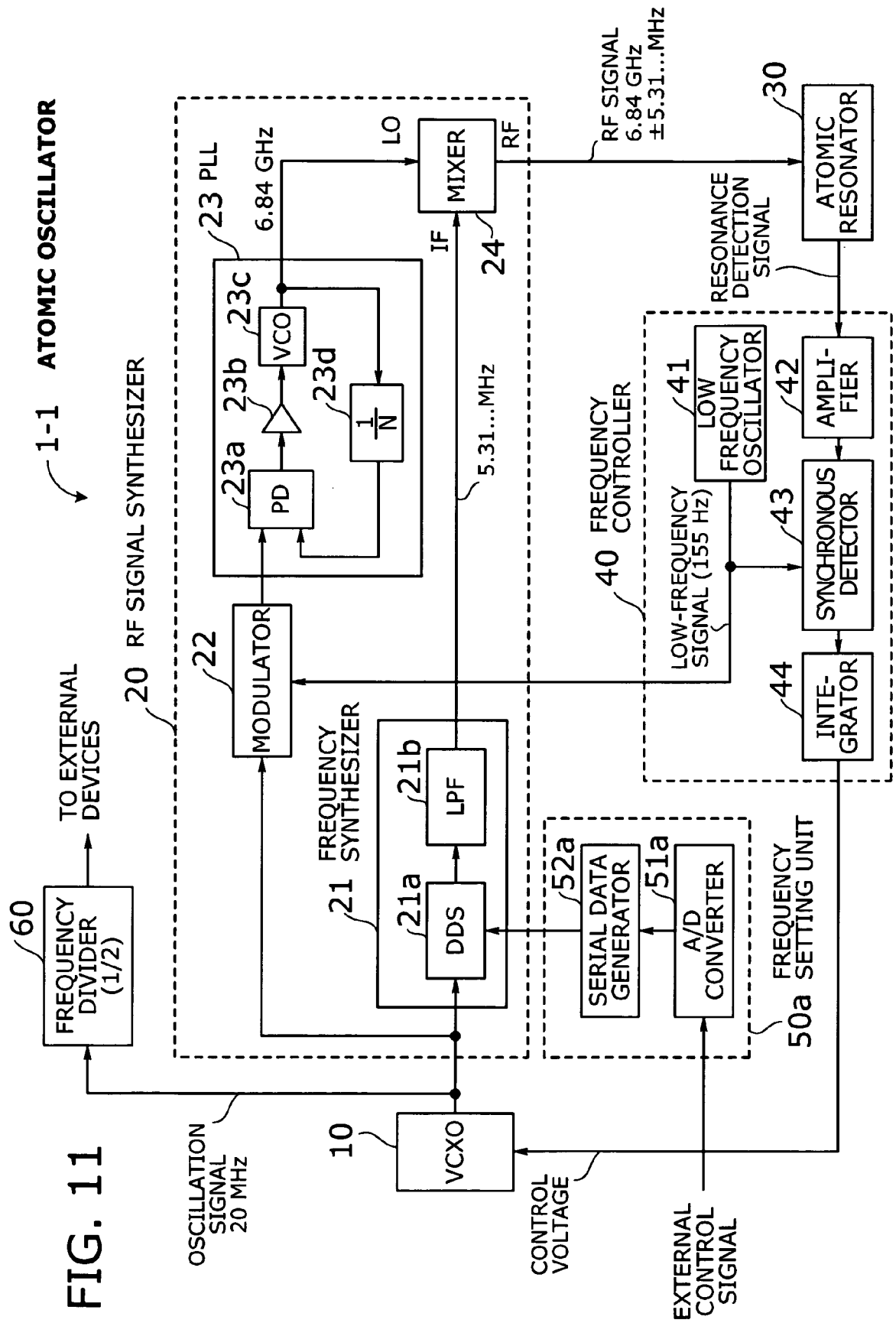
FIG. 11 shows the structure of another atomic oscillator.

This section will describe an atomic oscillator whose frequency can be tuned by an external control signal. FIG. 11 shows the structure of an atomic oscillator of this type. The illustrated atomic oscillator 1-1 has a frequency setting unit 50a that is composed of an A/D converter 51a and a serial data generator 52a. The other part of the oscillator 1-1 is similar to what we have described in FIG. 2.

The frequency setting unit 50a accepts a control voltage from an external source, allowing it to set the output frequency of the DDS 21a. The A/D converter 51a converts this external control signal into digital data. Based on this digital control data, the serial data generator 52a produces a series of data bits representing a phase increment. More specifically, the serial data generator 52a stores a parameter for setting the central frequency of DDS output, and it adds thereto the A/D-converted external control signal with an appropriate weighting factor. The resulting data is sent serially to the DDS 21a as a frequency control word.

Figure 12:
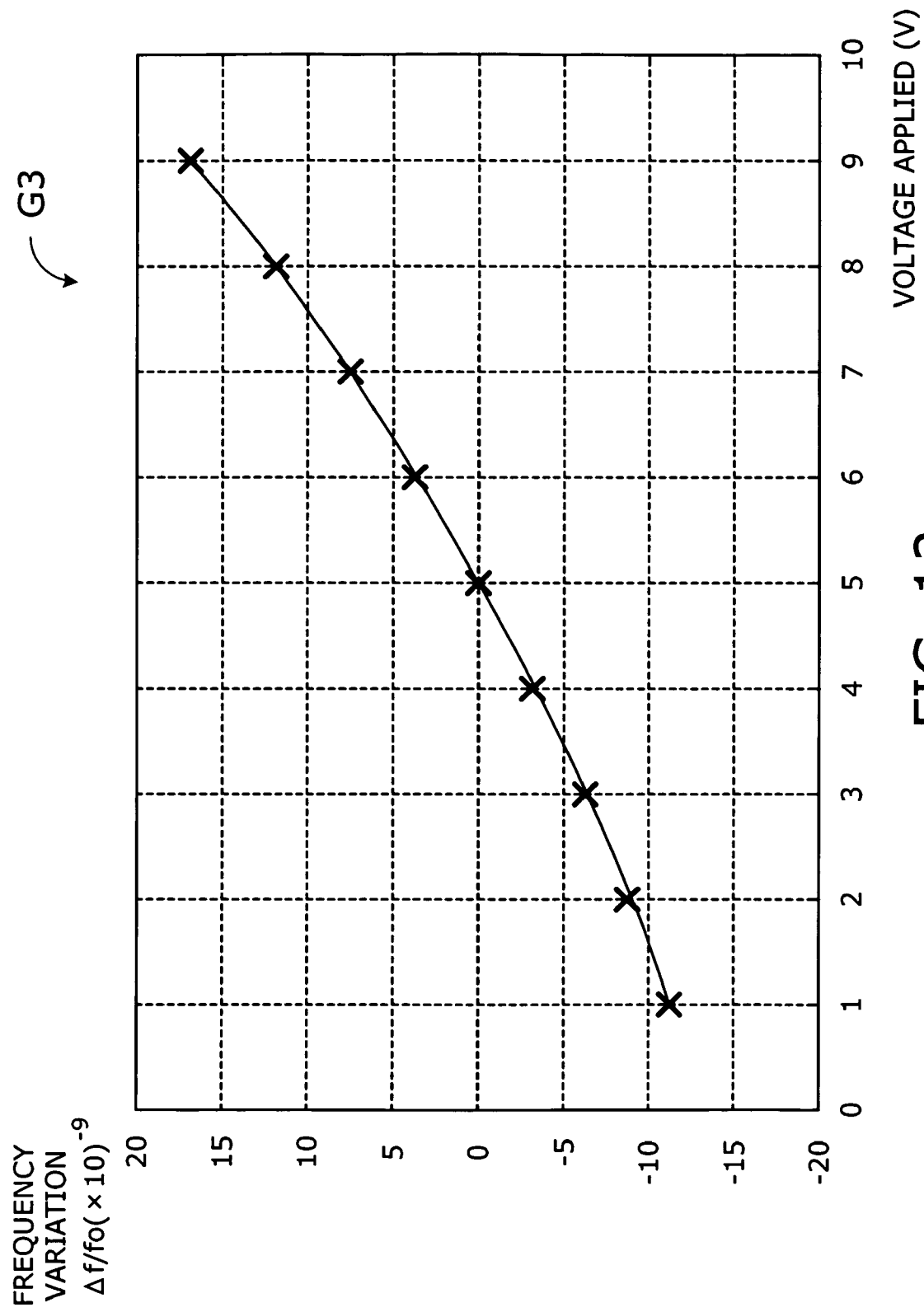
FIG. 12 shows how the output frequency is affected by C field strength.

The conventional method for varying the output frequency of a rubidium atomic oscillator is to shift the atomic resonance frequency by manipulating a magnetic field in the atomic resonator, which is called "C field." Specifically, the C field strength can be changed by applying an appropriate voltage to a coil placed in the atomic resonator. FIG. 12 shows how the output frequency is affected by the C-field strength, where the vertical axis represents output frequency variations and the horizontal axis represents the voltage applied. As this graph G3 demonstrates, the output frequency increases quadratically with the C-field coil voltage applied to the atomic resonator. This nonlinearity of atomic resonance frequency versus C-field strength makes it difficult for users to control the output frequency of an atomic oscillator.

According to the present invention, the proposed atomic oscillator 1-1 provides a linear response of its output frequency by changing the DDS frequency according to an external control signal. The following gives details of how the output frequency is varied in the present invention.

Let $f_R$ represent the atomic resonance frequency in MHz, N the bit width of the DDS 21a, and $\Delta\phi$ the value of frequency control word. The output frequency $F_{OUT}$ of the atomic oscillator 1-1, or the VCXO output before the frequency divider 60, is given by the following equation.

$$f_{OUT} = \frac{f_R}{2 \cdot \left(342 - \frac{\Delta\phi}{2^N}\right)} \tag{6}$$

Figure 13:
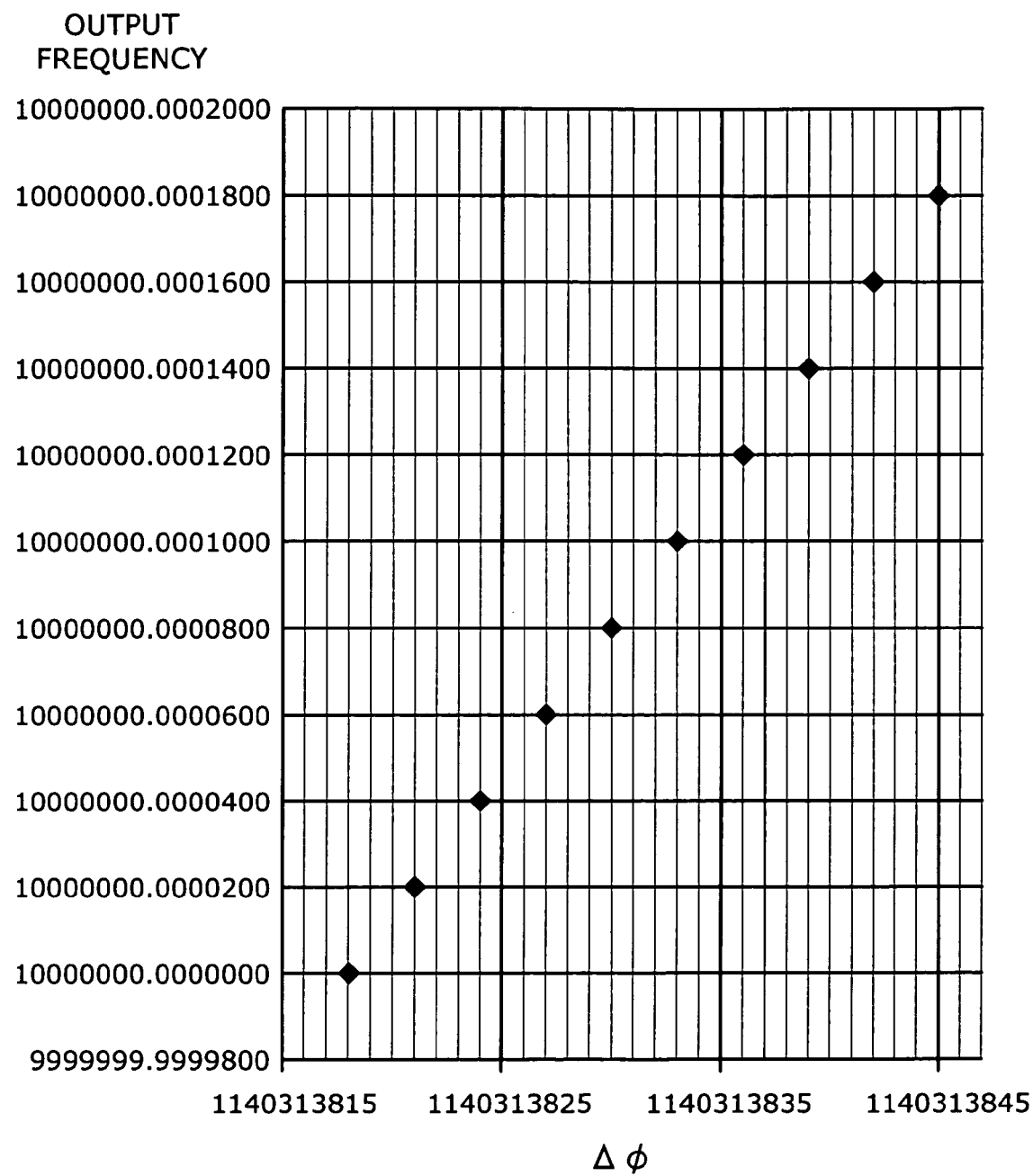
FIG. 13 shows how the output frequency varies with frequency control word values.

FIG. 13 is a graph showing how the output frequency $f_{OUT}$ varies in the case of $f_R$=6834.69 MHz and N=32. The vertical axis represents $f_{OUT}$ in Hz, while the horizontal axis represents $\Delta\phi$ in decimal value. As can be seen from this graph G4, the increase of output frequency is substantially linear with respect to frequency control word values $\Delta\phi$. The user can change the output frequency in a linear fashion by providing the A/D converter 51a with an external control voltage in proportion to the intended frequency control data $\Delta\phi$.

Frequency resolution of the atomic oscillator 1-1 in this case is given as follows.

$$\frac{\Delta f}{f_o} = \frac{\frac{20}{2^{32}}}{6834.69} = 6.8 \times 10^{-13} \tag{7}$$

Since the DDS is set up with digital values, the variation of output frequency is not continuous, but discrete as shown in FIG. 13. Practically, however, the resolution given by equation (7) is so fine that the user will perceive it to be continuous, just as in the conventional C-field control.

Temperature Compensation

Figure 14:
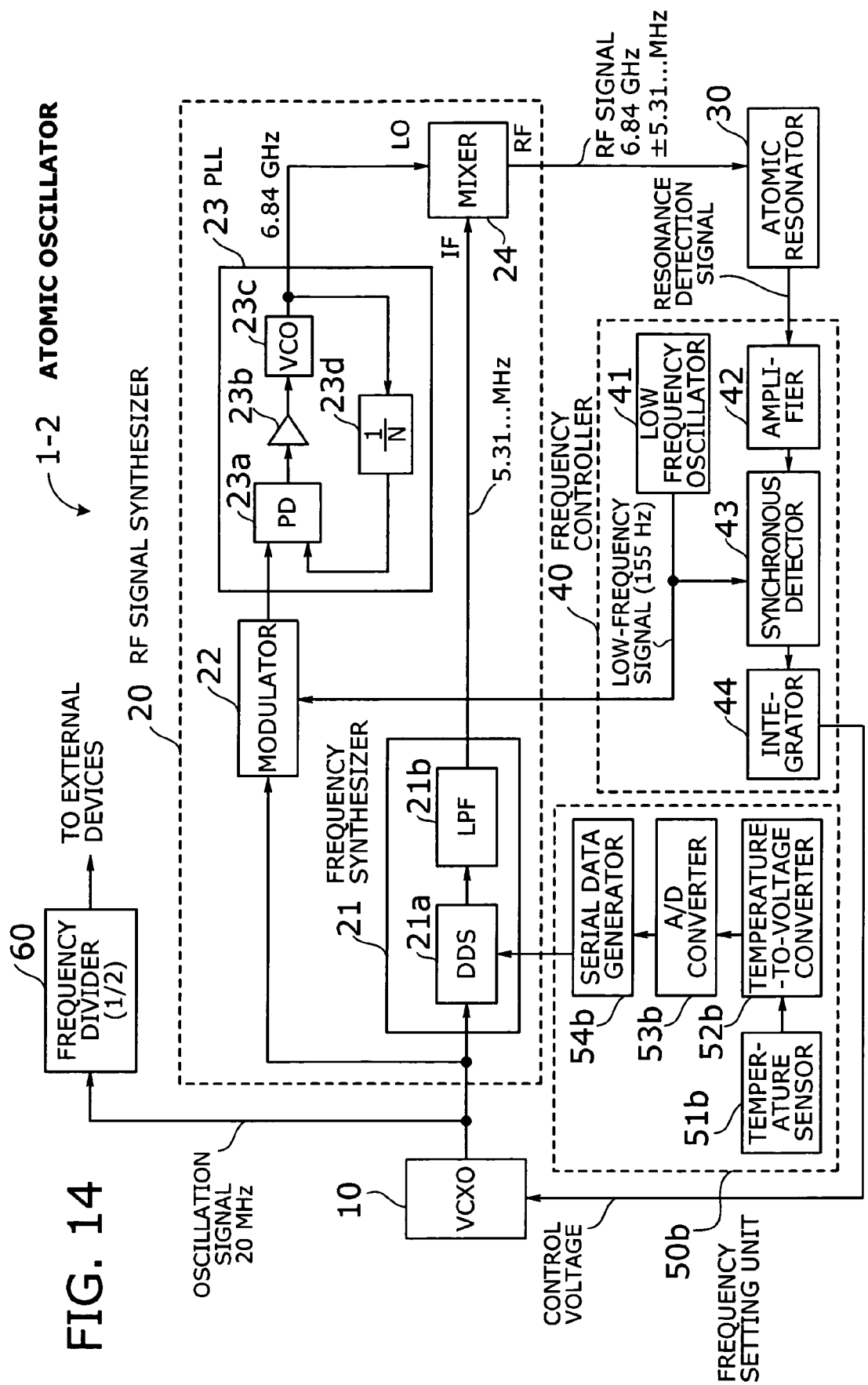
FIG. 14 shows the structure of yet another atomic oscillator.

According to the present invention, the output frequency of an atomic oscillator can be stabilized by manipulating the DDS output frequency to compensate for ambient temperature variations. FIG. 14 shows the structure of an atomic oscillator with such a temperature compensation function. The illustrated atomic oscillator 1-2 has a frequency setting unit 50b composed of a temperature sensor 51b, a temperature/voltage converter 52b, an A/D converter 53b, and a serial data generator 54b. The other part of the oscillator 1-2 is similar to what we have described in FIG. 2.

The temperature sensor 51b senses ambient temperature, and the temperature/voltage converter 52b converts the sensor output to a dc voltage and sends it to the A/D converter 53b. The A/D converter 53b converts the dc voltage signal into temperature data in the digital domain. The serial data generator 54b stores a parameter for setting the central frequency of DDS output, and it adds thereto, or subtracts therefrom, the temperature data with an appropriate weighting factor. The resulting data is sent to the DDS 21a as a frequency control word.

Rubidium atomic oscillators have a particular temperature coefficient of output frequency, the sign of which does not change. The serial data generator 54b is thus designed to give an appropriate weighting factor to temperature measurements, so that the oscillator's temperature drift will be corrected. This feature permits the frequency offset between the RF signal and atomic resonance frequency to vary with the ambient temperature, counteracting the temperature drift of output frequency.

Age Deterioration Compensation

Figure 15:
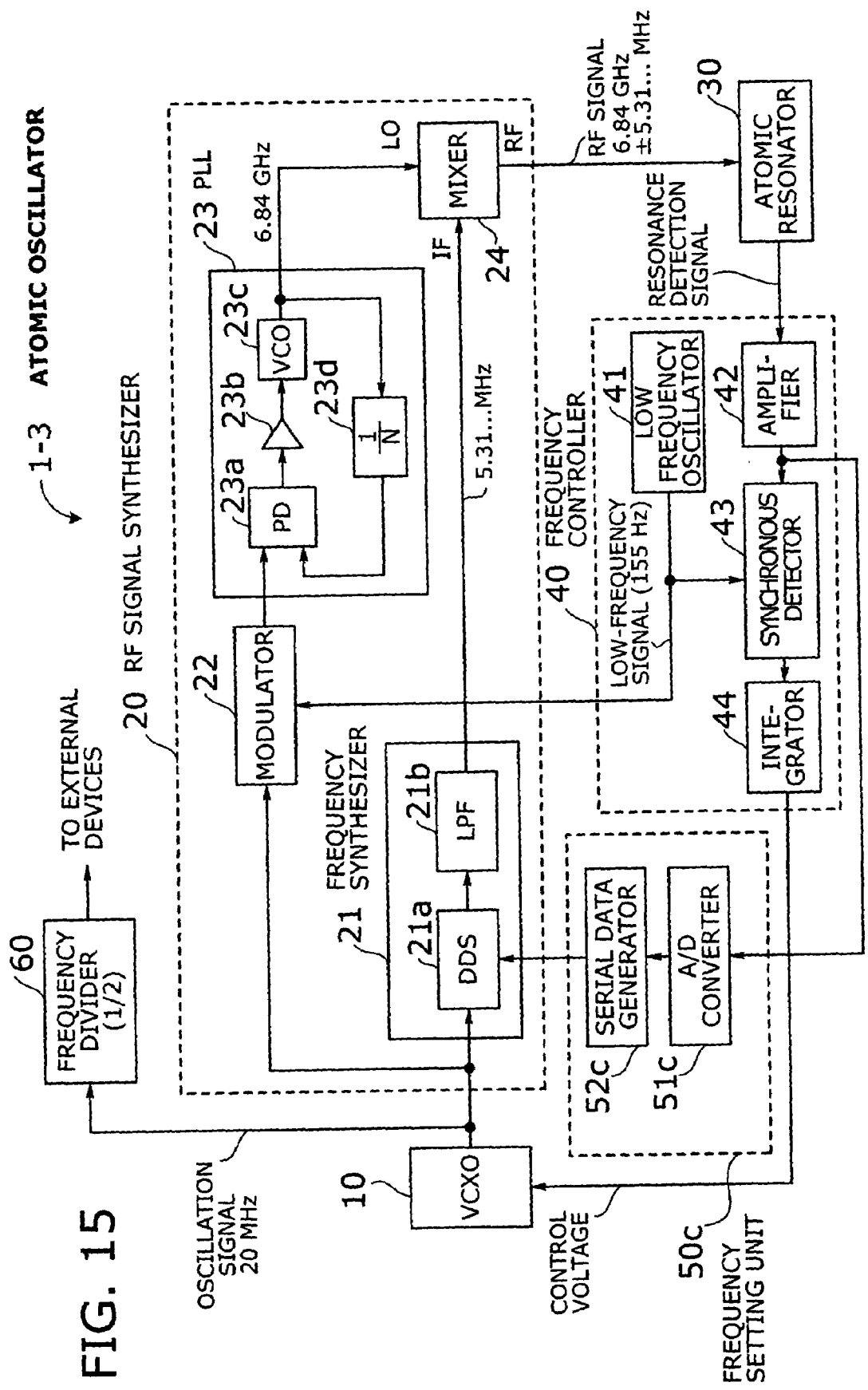
FIG. 15 shows the structure of still another atomic oscillator.

The output frequency of an atomic oscillator may also drift over time, due to age deterioration of components used. For better long-term stability, the DDS frequency is manipulated to compensate for such deterioration. FIG. 15 shows the structure of an atomic oscillator with a compensation function. In the illustrated atomic oscillator 1-3, the frequency setting unit 50c is composed of an A/D converter 51c and a serial data generator 52c, and the output of the amplifier 42 is routed to the input of the A/D converter 51c. The other part of the oscillator 1-3 is similar to what we have described in FIG. 2.

The amplifier 42 amplifies a resonance detection signal, which indicates the amount of rubidium lamp light, for delivery to the synchronous detector 43 and A/D converter 51c. The A/D converter 51c converts this signal into digital form, thus outputting light strength variation data. The serial data generator 52c stores a parameter for setting the central frequency of DDS output, and it adds thereto, or subtracts therefrom, the light strength variation data with an appropriate weighting factor. The result is sent to the DDS 21a as a frequency control word.

The light strength of a rubidium lamp varies over time because of the deterioration due to aging, resulting in a frequency drift of the atomic oscillator. The serial data generator 52c is thus designed to give an appropriate weighting factor to lamp light measurements, so that the oscillator's long-term drift will be corrected. This feature permits the frequency offset between the RF signal and atomic resonance frequency to vary with the age of the lamp, counteracting the drift of output frequency due to age deterioration.

Frequency Setting Unit

Figure 16:
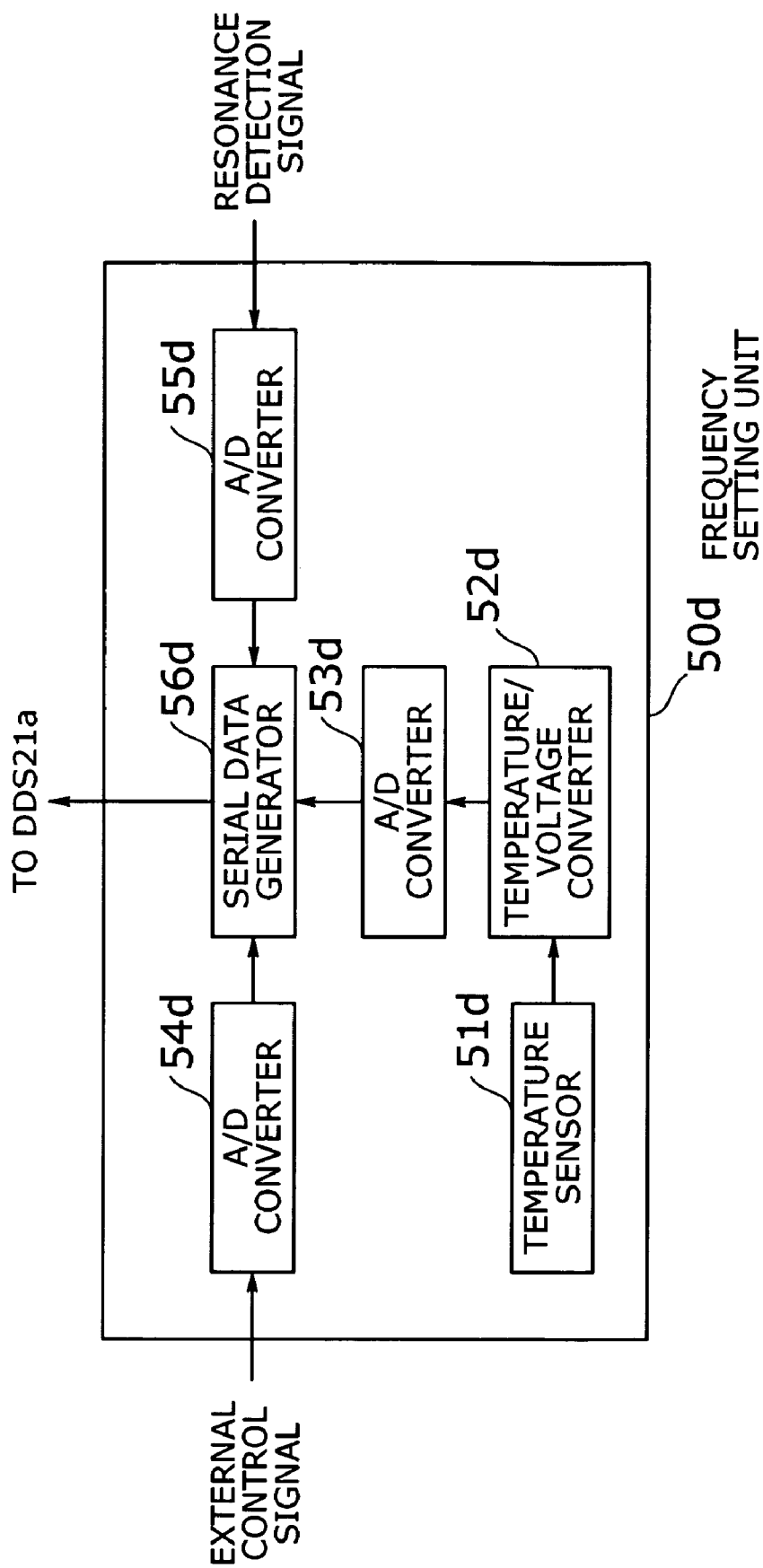
FIG. 16 shows the structure of a frequency setting unit.

All the features of external frequency control, temperature compensation, and age deterioration compensation can be implemented in a single atomic oscillator as follows. FIG. 16 shows the structure of a frequency setting unit 50d for use in such an atomic oscillator. This frequency setting unit 50d is composed of a temperature sensor 51d, a temperature/voltage converter 52d, A/D converters 53d to 55d, and a serial data generator 56d. As in the foregoing frequency setting unit 50c, the A/D converter 51c receives the output signal of the amplifier 42.

The first A/D converter 53d converts an external control voltage into a digital value for the purpose of processing in the serial data generator 56d. The second A/D converter 54d does the same for an ambient temperature signal from the temperature sensor 51d, and the third A/D converter 55d for a resonance detection signal representing the lamp light strength. The serial data generator 56d stores a parameter for setting the central frequency of DDS output, and it adds thereto, or subtracts therefrom, those pieces of digital data with appropriate weighting factors. The result is sent to the DDS 21a as a frequency control word.

The above-described serial data generator 56d enables the atomic oscillator to function as a voltage-controlled rubidium oscillator (VCRO), whose output frequency can be varied with an external control signal. Additionally, the serial data generator 56d makes it possible to correct error in the output frequency that could be caused by temperature changes or long-term deterioration of rubidium lamp light. This feature of the present invention contributes to improved frequency stability of the oscillator.

Modulation of DDS Output

Figure 17:
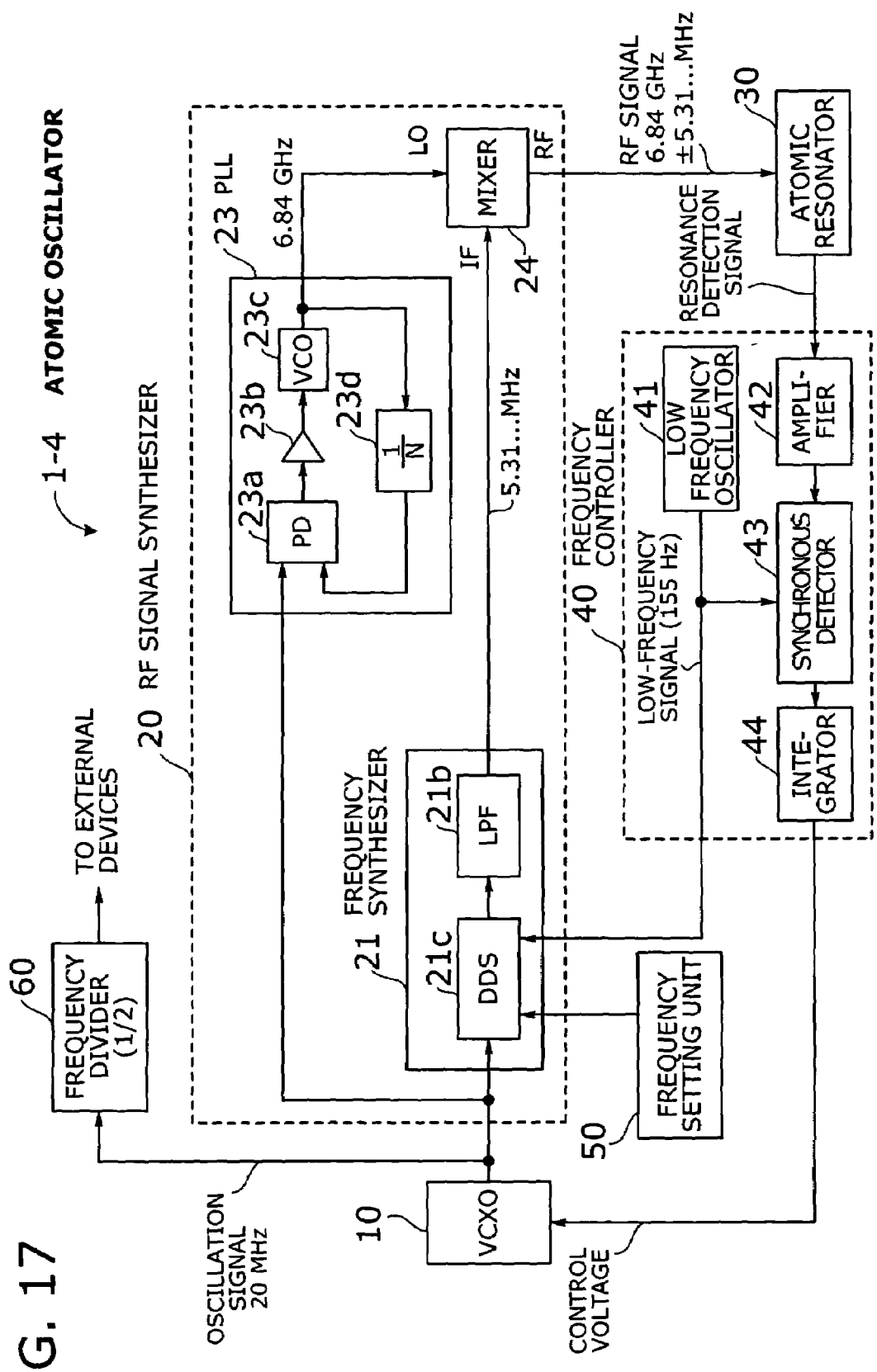
FIG. 17 shows the structure of still another atomic oscillator.
Figure 18:
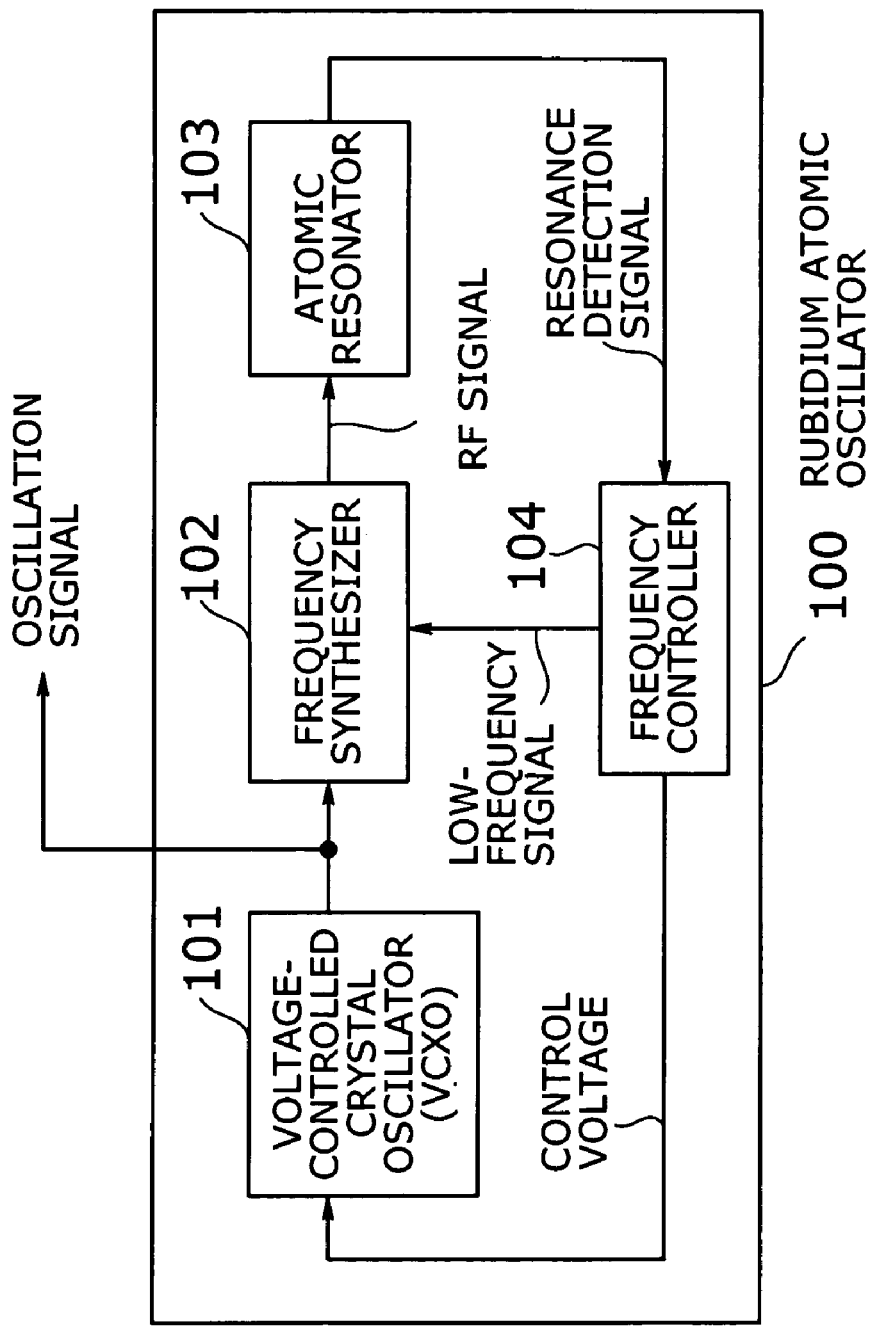
FIG. 18 shows a typical basic structure of a conventional rubidium atomic oscillator.

The atomic oscillator 1 of FIG. 2 employs a modulator 22 to modulate the RF signal with a low-frequency signal. As an alternative configuration, the modulation may be applied on the DDS output. FIG. 17 shows the structure of an atomic oscillator with a DDS having a modulation input. In this atomic oscillator 1-4, the PLL 23 receives a reference clock signal directly from the VCXO 10, with no frequency modulator between them. The output of the low frequency oscillator 41 is supplied to the DDS 21c for use as a modulation control signal, so that the DDS output frequency will be modulated at a low frequency. The other part of the oscillator 1-4 is similar to what we have described in FIG. 2.

Today's DDS devices offer a plurality of frequency registers and phase registers, which can be switched by an external control command. The atomic oscillator 1-4 of the present invention takes advantage of this additional DDS capability in producing a frequency-modulated signal. More specifically, frequency registers are used to store two output frequencies with a distance of a few hundred Hz, on both sides of the central frequency of 5.311 . . . MHz (the offset between VCO output frequency 6.84 GHz and atomic resonance frequency 6.834689 GHz). The low frequency oscillator 41 delivers its output to the DDS 21c to specify which frequency register to select, thereby frequency-modulating the DDS output. This frequency-modulated DDS output is entered to IF input port of the mixer 24, which naturally causes the RF signal output to be frequency-modulated. One of the RF components has a frequency of 6.83469 . . . GHz (6.84 GHz–5.311 . . . MHz), which triggers resonance of rubidium atoms. A feedback loop is formed in this way to regulate the output frequency of the atomic oscillator 1-4.

The oscillator structure of FIG. 17 uses a built-in function of DDS devices to modulate the RF signal and eliminates a modulator, thus contributing to circuit size reduction. It should also be noted that the atomic oscillator 1-4 of FIG. 17 is ready for modification to incorporate additional features into the frequency setting unit 50, as in the foregoing oscillators 1-1, 1-2, and 1-3 we have described in FIGS. 11 to 16.

CONCLUSION

As can be seen from the preceding discussion, the present invention provides an atomic oscillator with advantageous synthesizer structure. The RF signal synthesizer produces an RF signal by mixing two frequencies using a mixer circuit. A first frequency is generated by a PLL that converts a modulated oscillation signal up to an atomic resonance frequency band. The PLL contains a voltage-controlled oscillator to directly generate this high frequency, which is an integer multiple of the source oscillation signal. A second frequency, on the other hand, is produced by a digital frequency synthesizer that uses a given oscillator signal as a clock input signal. The second frequency is determined by a frequency control word, which may be varied as necessary.

The proposed structure offers an improved S/N ratio in detecting atomic resonance, as well as allowing fine-tuning of the oscillator's output frequency. The frequency control word may be modified to compensate for the discharge lamp light variations due to temperature changes and/or age deterioration. Those feature of the present invention contribute to performance improvement and long-term stability of the atomic oscillator.

Another advantage of the proposed structure is elimination of frequency multipliers from the frequency synthesizer design. Multipliers are costly because they require fabrication of distributed-constant circuit patterns, selection of PC board material with a particular dielectric constant, and adjustment of circuit characteristics. Elimination of frequency multipliers contributes to the realization of a compact, low-cost rubidium atomic oscillator.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An atomic oscillator whose resonance frequency derives from atomic transitions, the oscillator comprising:
   (a) a voltage-controlled oscillator that produces an oscillation signal based on a given control voltage;
   (b) a radio-frequency (RF) signal synthesizer that produces an RF signal, comprising:
      a modulator that modulates the oscillation signal with a given low-frequency signal,
      a phase-locked loop (PLL) that directly produces a first frequency in an atomic resonance frequency band in synchronization with the modulated oscillation signal, the first frequency being an integer multiple of the frequency of the oscillation signal given by said voltage-controlled oscillator,
      a frequency synthesizer that creates a second frequency by using the oscillation signal as an input clock signal, the second frequency being specified by a frequency control word, and
      a mixer that mixes the first and second frequencies to produce the RF signal;
   (c) an atomic resonator in which atoms in an electromagnetic field of the RF signal interact with discharge lamp light passing therethrough, depending on a difference between the RF signal frequency and atomic resonance frequency, said atomic resonator having a sensor that produces a resonance detection signal representing the amount of unabsorbed discharge lamp light;
   (d) a frequency controller that produces the control voltage by performing synchronous detection on the resonance detection signal; and
   (e) a frequency setting unit that sets the frequency control word to specify the second frequency of said frequency synthesizer.

2. The atomic oscillator according to claim 1, wherein the second frequency produced by said frequency synthesizer is offset frequency of the first frequency with respect to the atomic resonance frequency.

3. The atomic oscillator according to claim 1, wherein said frequency setting unit varies the frequency control word according to an external control signal.

4. The atomic oscillator according to claim 1, wherein:
   said frequency setting unit comprises a temperature sensor to measure ambient temperature; and
   said frequency setting unit varies the frequency control word according to ambient temperature measurements to compensate for temperature dependence of the discharge lamp light and thereby regulate the frequency of the oscillation signal.

5. The atomic oscillator according to claim 1, wherein said frequency setting unit varies the frequency control word according to the resonance detection signal to compensate for age deterioration of the discharge lamp light and thereby regulate the frequency of the oscillation signal.

6. An atomic oscillator whose resonance frequency derives from atomic transitions, the oscillator comprising:
   (a) a voltage-controlled oscillator that produces an oscillation signal based on a given control voltage;
   (b) a radio-frequency (RF) signal generator that produces an RF signal, comprising:
      a phase-locked loop (PLL) that directly produces a first frequency in an atomic resonance frequency band in synchronization with the oscillation signal, the first frequency being an integer multiple of the frequency of the oscillation signal,
      a frequency synthesizer that creates a second frequency by using the oscillation signal as an input clock signal, the second frequency being specified by a frequency control word and modulated with a given low-frequency signal, and
      a mixer that mixes the first and second frequencies to produce the RF signal;
   (c) an atomic resonator in which atoms in an electromagnetic field of the RF signal interact with discharge lamp light passing therethrough, depending on a difference between the RF signal frequency and atomic resonance frequency, said atomic resonator having a sensor that produces a resonance detection signal representing the amount of unabsorbed discharge lamp light;
   (d) a frequency controller that produces the control voltage by performing synchronous detection on the resonance detection signal; and (e) a frequency setting unit that sets the frequency control word to specify the second frequency of said frequency synthesizer.

7. The atomic oscillator according to claim 6, wherein the second frequency produced by said frequency synthesizer is offset frequency of the first frequency with respect to the atomic resonance frequency.

8. The atomic oscillator according to claim 6, wherein said frequency setting unit varies the frequency control word according to an external control signal.

9. The atomic oscillator according to claim 6, wherein:
said frequency setting unit has a temperature sensor to measure ambient temperature; and
said frequency setting unit varies the frequency control word according to ambient temperature measurements to compensate for temperature dependence of the discharge lamp light and thereby regulate the frequency of the oscillation signal.

10. The atomic oscillator according to claim 6, wherein said frequency setting unit varies the frequency control word according to the resonance detection signal to compensate for age deterioration of the discharge lamp light and thereby regulate the frequency of the oscillation signal.

* * * * *